US007215909B2

(12) United States Patent
Nittani et al.

(10) Patent No.: US 7,215,909 B2
(45) Date of Patent: May 8, 2007

(54) DEVELOPING DEVICE, AND PROCESS CARTRIDGE MAINTAINING POSITION OF DEVELOPING ROLLER, AND IMAGE FORMING APPARATUS USING THESE

(75) Inventors: Susumu Nittani, Shizuoka (JP); Kanji Yokomori, Kanagawa (JP); Masatomo Tsuduki, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/222,788

(22) Filed: Sep. 12, 2005

(65) Prior Publication Data

US 2006/0013618 A1 Jan. 19, 2006

Related U.S. Application Data

(62) Division of application No. 10/403,282, filed on Apr. 1, 2003, now Pat. No. 7,024,137.

(30) Foreign Application Priority Data

Jun. 3, 2002 (JP) ............................ 2002-161808

(51) Int. Cl.
*G03G 15/06* (2006.01)
*G03F 15/04* (2006.01)

(52) U.S. Cl. ...................................... 399/222; 399/119

(58) Field of Classification Search ..................... None
See application file for complete search history.

(56) References Cited

U.S. PATENT DOCUMENTS 5,682,587 A 10/1997 Higeta et al. ............... 399/277
5,815,782 A 9/1998 Yokomori et al. .......... 399/285
5,839,028 A 11/1998 Nomura et al. ............. 399/109
5,878,309 A 3/1999 Nomura et al. ............. 399/111
5,940,657 A 8/1999 Yokomori et al. .......... 399/119
5,943,528 A 8/1999 Akutsu et al. .............. 399/110
5,950,049 A 9/1999 Yokomori et al. .......... 399/119
5,953,562 A 9/1999 Kawaguchi et al. ........ 399/117
6,029,031 A 2/2000 Yokomori et al. .......... 399/109
6,055,406 A 4/2000 Kawai et al. ............... 399/360
6,064,843 A 5/2000 Isobe et al. ................ 399/111
6,072,969 A 6/2000 Yokomori et al. .......... 399/119
6,215,969 B1 4/2001 Nomura et al. ............. 399/111
6,345,164 B1 2/2002 Yokomori et al. .......... 399/119

(Continued)

FOREIGN PATENT DOCUMENTS

JP 7-225538 A 8/1995

(Continued)

*Primary Examiner*—Quana Grainger
(74) *Attorney, Agent, or Firm*—Fitzpatrick, Cella, Harper & Scinto

(57) ABSTRACT

Disclosed are a developing device, a developing cartridge, a process cartridge, and an image forming apparatus in which image deficiency is prevented by absorbing the tolerance of each component and making the position of the developing roller in the thrust direction constant and which are easy to assemble. A frame member is equipped with an urging unit that axially urges the developing roller, the urging unit urging the developing roller in the direction of movement of the developing roller by the thrust force of a helical gear when a driving force is transmitted to the developing roller, to thereby make the position of the developing roller in the thrust direction constant.

6 Claims, 19 Drawing Sheets

U.S. PATENT DOCUMENTS

| | | | | |
|---|---|---|---|---|
| 6,381,430 | B1 | 4/2002 | Yokomori et al. | 399/119 |
| 6,459,869 | B2 | 10/2002 | Nittani et al. | 399/111 |
| 6,463,232 | B1 | 10/2002 | Kawai et al. | 399/111 |
| 6,463,234 | B2 | 10/2002 | Arimitsu et al. | 399/113 |
| 6,480,687 | B1 | 11/2002 | Kawai et al. | 399/111 |
| 6,934,489 | B2 | 8/2005 | Yokomori et al. | 399/111 |
| 2002/0081126 | A1 | 6/2002 | Yokomori et al. | 399/118 |
| 2002/0110386 | A1 | 8/2002 | Kanno et al. | 399/111 |
| 2002/0110388 | A1 | 8/2002 | Yokomori et al. | 399/167 |
| 2002/0176721 | A1* | 11/2002 | Aoki et al. | 399/159 |
| 2003/0161654 | A1 | 8/2003 | Yokomori et al. | 399/111 |

FOREIGN PATENT DOCUMENTS

| | | |
|---|---|---|
| JP | 2003-21970 | 1/2003 |

* cited by examiner

DEVELOPING DEVICE, AND PROCESS CARTRIDGE MAINTAINING POSITION OF DEVELOPING ROLLER, AND IMAGE FORMING APPARATUS USING THESE

CROSS REFERENCE TO RELATED APPLICATION

This application is a divisional application of application Ser. No. 10/403,282, filed Apr. 1, 2003 now U.S. Pat. No. 7,024,137.

This application claims the right of priority under 35 U.S.C. § 119 based on Japanese Patent Application No. JP 2002-161808 which is hereby incorporated by reference herein in its entirety as if fully set forth herein.

BACKGROUND OF THE INVENTION

1. Field of the Invention

The present invention relates to a developing device, a developing cartridge, a process cartridge, and an image forming apparatus using these, which are applicable to an electrophotographic copying machine, printer or the like.

2. Description of the Related Art

Conventionally, an image forming apparatus using the electrophotographic image forming process adopts a process cartridge system, in which the image bearing member and the process means acting thereon are integrated into a cartridge, which is detachable with respect to the image forming apparatus main body. In this process cartridge system, the user can perform maintenance on the apparatus without relying on a serviceman, thus achieving a substantial improvement in terms of operability. As a result, this process cartridge system has come to be widely adopted in image forming apparatuses.

FIG. 17 shows an example of an image forming apparatus adopting this cartridge system, comprising an in-line type color printer 200 in which a plurality of process cartridges are arranged in a row. Regarding the developing means of process cartridges 207 (207*a*–207*d*) used in the image forming apparatus, two systems are generally known: a contact type development system in which development is performed with a developing roller 240 (240*a*–240*d*) being in contact with a photosensitive drum 201 (201*a*–201*d*) serving as the image bearing member, and a non-contact type development system in which development is performed with the developing roller being spaced apart from the photosensitive drum by a predetermined gap.

As an example of the developing device of a process cartridge, a developing device as shown in FIG. 18 has been proposed and put into practical use. The conventional developing device 207 shown in FIG. 18 has a developer container 245 containing a non-magnetic mono-component toner and equipped with a developing roller 240 serving as a developer carrying member, a developing blade 244 serving as a developer regulating member, and an application roller 243 serving as a developer applying member. The toner supplied to the developing roller 240 is conveyed to the portion where it abuts the developing blade 244 as the developing roller 240 rotates. Here, the toner on the developing roller 240 is turned into a uniform thin layer (toner coat) by the developing blade 244.

A developing bias is applied to the developing roller 240, and the toner on the developing roller 240 moves in correspondence with an electrostatic latent image formed on the photosensitive drum 201, visualizing a toner image on the photosensitive drum 201.

FIG. 19 is a longitudinal sectional view of the process cartridge. Here, the sectional view is taken along a plane passing the center of the developing roller 240.

As shown in FIG. 19, the developing roller 240 is rotatably mounted to bearing portions 247*a* and 248*a* of retaining members 247 and 248. Here, at one end of the developing roller 240, there is provided a regulating portion 240*c* for regulating the longitudinal moving amount of the developing roller 240. Further, mounted to the end surface on the opposite side is a helical gear 279 serving as a driving force transmission member for driving the developing roller. The torsional direction of the helical gear 279 is such that the thrust force generated when the driving force is applied to the developing roller 240 causes the developing roller 240 to move in the direction of the arrow C in the drawing.

Thus, in the state in which driving force is being applied to the developing roller 240, the developing roller 240 is constantly held at a fixed position by the thrust force of the helical gear and the regulating portion 240*c*, and it is possible to prevent image deficiency (so-called out of color registration generated when a number of colors are superimposed one upon the other) due to oscillation of the developing roller 240 in the thrust direction (the y-direction in the drawing).

However, in the conventional construction, it is necessary to provide play in the thrust direction of the developing roller 240 in order to absorb expansion and contraction of the developer container, etc., due to environmental fluctuation and the tolerance of each component. Thus, when no driving force is being applied to the developing roller 240, the developing roller 240 is movable in the thrust direction with respect to the developer container 245 and the developing blade 244.

Here, it is to be expected that during its transportation, the process cartridge suffers from vibrations in various directions. When it suffers from vibration in the longitudinal direction of the developing roller, it can happen that the developing roller 240 vibrates in the thrust direction within the process cartridge 207. At this time, the developing roller 240 and the developing blade 244 are rubbed against each other, with the result that the developing roller 240 undergoes deformation. Further, also when the developing roller 240 is moved by the thrust force generated by the helical gear 279, the developing roller 240 may suffer from a similar deformation.

Furthermore, the positional relationship between the point of contact 276 through which bias is supplied to the developing roller 240 and the developing roller 240 is not fixed. When a driving force is applied to the developing roller 240, the developing roller 240 moves to the regulating position due to the thrust force generated through meshing of the helical gear 279. However, the contact pressure immediately after the application of the driving force to the developing roller 240 is not fixed.

SUMMARY OF THE INVENTION

It is an object of the present invention to provide a developing device, a developing cartridge, a process cartridge, and an image forming apparatus in which the position of the developing roller in the thrust direction can remain constant.

Another object of the present invention is to provide a developing device, a developing cartridge, a process cartridge, and an image forming apparatus in which the position of the developing roller in the thrust direction can remain constant not only during image formation, but also during transportation.

Still another object of the present invention is to provide a developing device, a developing cartridge, a process cartridge, and an image forming apparatus in which the position of the developing roller in the thrust direction can remain constant not only during image formation, but also during the attachment of a developing device, a developing cartridge, and a process cartridge to the image formation apparatus.

A further object of the present invention is to provide a developing device, a developing cartridge, a process cartridge, and an image forming apparatus in which the positional relationship between the developing roller and the developing blade in the thrust direction can remain constant.

A further object of the present invention is to provide a developing device, a developing cartridge, a process cartridge, and an image forming apparatus in which the positional relationship between the developing roller and the developing blade in the thrust direction can remain constant, whereby it is possible to prevent deformation of the elastic roller portion of the developing roller due to movement of the developing roller in the thrust direction.

A further object of the present invention is to provide a developing device, a developing cartridge, a process cartridge, and an image forming apparatus in which the electrical contact for supplying developing bias to the developing roller from the image forming apparatus main body can be kept in stable contact with the developing roller.

A further object of the present invention is to provide a developing device, a developing cartridge, a process cartridge, and an image forming apparatus which are easy to assemble.

A further object of the present invention is to provide a developing device installed in an image forming apparatus main body, including:

a frame member;

a developing roller supported by the frame member and adapted to develop a latent image formed on an electrophotographic photosensitive member;

a developing blade adapted to regulate the thickness of a toner layer borne by the developing roller;

a helical gear provided at one end of the developing roller in an axial direction thereof and adapted to transmit a driving force to the developing roller; and an urging unit that axially urges the developing roller, the urging unit urging the developing roller in a direction of movement of the developing roller by a thrust force of the helical gear when the driving force is transmitted to the developing roller.

A further object of the present invention is to provide a process cartridge detachable with respect to an image forming apparatus main body, including:

an electrophotographic photosensitive member;

a frame member;

a developing roller supported by the frame member and adapted to develop a latent image formed on the electrophotographic photosensitive member;

a developing blade adapted to regulate the thickness of a toner layer borne by the developing roller;

a helical gear provided at one end of the developing roller in an axial direction thereof and adapted to transmit a driving force to the developing roller; and an urging unit that axially urges the developing roller, the urging unit urging the developing roller in a direction of movement of the developing roller by a thrust force of the helical gear when the driving force is transmitted to the developing roller.

A further object of the present invention is to provide a developing cartridge detachable with respect to an image forming apparatus main body, including:

a frame member;

a developing roller supported by the frame member and adapted to develop a latent image formed on an electrophotographic photosensitive member;

a developing blade adapted to regulate the thickness of a toner layer borne by the developing roller;

a helical gear provided at one end of the developing roller in an axial direction thereof and adapted to transmit a driving force to the developing roller; and an urging unit that axially urges the developing roller, the urging unit urging the developing roller in a direction of movement of the developing roller by a thrust force of the helical gear when the driving force is transmitted to the developing roller.

A further object of the present invention is to provide an image forming apparatus which forms an image on a recording medium, including:

(i) a developing device including:

a frame member;

a developing roller supported by the frame member and adapted to develop a latent image formed on an electrophotographic photosensitive member;

a developing blade adapted to regulate the thickness of a toner layer borne by the developing roller;

a helical gear provided at one end of the developing roller in an axial direction thereof and adapted to transmit a driving force to the developing roller; and an urging unit that axially urges the developing roller, the urging unit urging the developing roller in a direction of movement of the developing roller by a thrust force of the helical gear when the driving force is transmitted to the developing roller; and (ii) a conveying unit that conveys the recording medium.

A further object of the present invention is to provide an image forming apparatus to which a process cartridge is detachably attached and which forms an image on a recording medium, including:

(i) an attachment portion;

(ii) a process cartridge detachably attached to the attachment portion and including:

an electrophotographic photosensitive member;

a frame member;

a developing roller supported by the frame member and adapted to develop a latent image formed on the electrophotographic photosensitive member;

a developing blade adapted to regulate the thickness of a toner layer borne by the developing roller;

a helical gear provided at one end of the developing roller in an axial direction thereof and adapted to transmit a driving force to the developing roller; and an urging unit that axially urges the developing roller, the urging unit urging the developing roller in a direction of movement of the developing roller by a thrust force of the helical gear when the driving force is transmitted to the developing roller; and (iii) a conveying unit that conveys the recording medium.

A further object of the present invention is to provide an image forming apparatus to which a developing cartridge is detachably attached and which forms an image on a recording medium, including:

(i) an attachment portion;
(ii) a developing cartridge detachably attached to the attachment portion and including:
a frame member;
a developing roller supported by the frame member and adapted to develop a latent image formed on an electrophotographic photosensitive member;
a developing blade adapted to regulate the thickness of a toner layer borne by the developing roller;
a helical gear provided at one end of the developing roller in an axial direction thereof and adapted to transmit a driving force to the developing roller; and
an urging unit that axially urges the developing roller, the urging unit urging the developing roller in a direction of movement of the developing roller by a thrust force of the helical gear when the driving force is transmitted to the developing roller; and
(iii) a conveying unit that conveys the recording medium.

DETAILED DESCRIPTION OF THE PREFERRED EMBODIMENTS

Preferred embodiments of this invention will now be described in detail with reference to the drawings. Note that, unless otherwise specified, the sizes, materials, configurations, and positional relationship of the components of these embodiments should not be construed restrictively.

(First Embodiment)

A developing device, a developing cartridge, a process cartridge, and an image forming apparatus according to a first embodiment of the present invention will be described with reference to FIGS. 1 through 11.

(General Construction of the Image Forming Apparatus)

Figure 2:
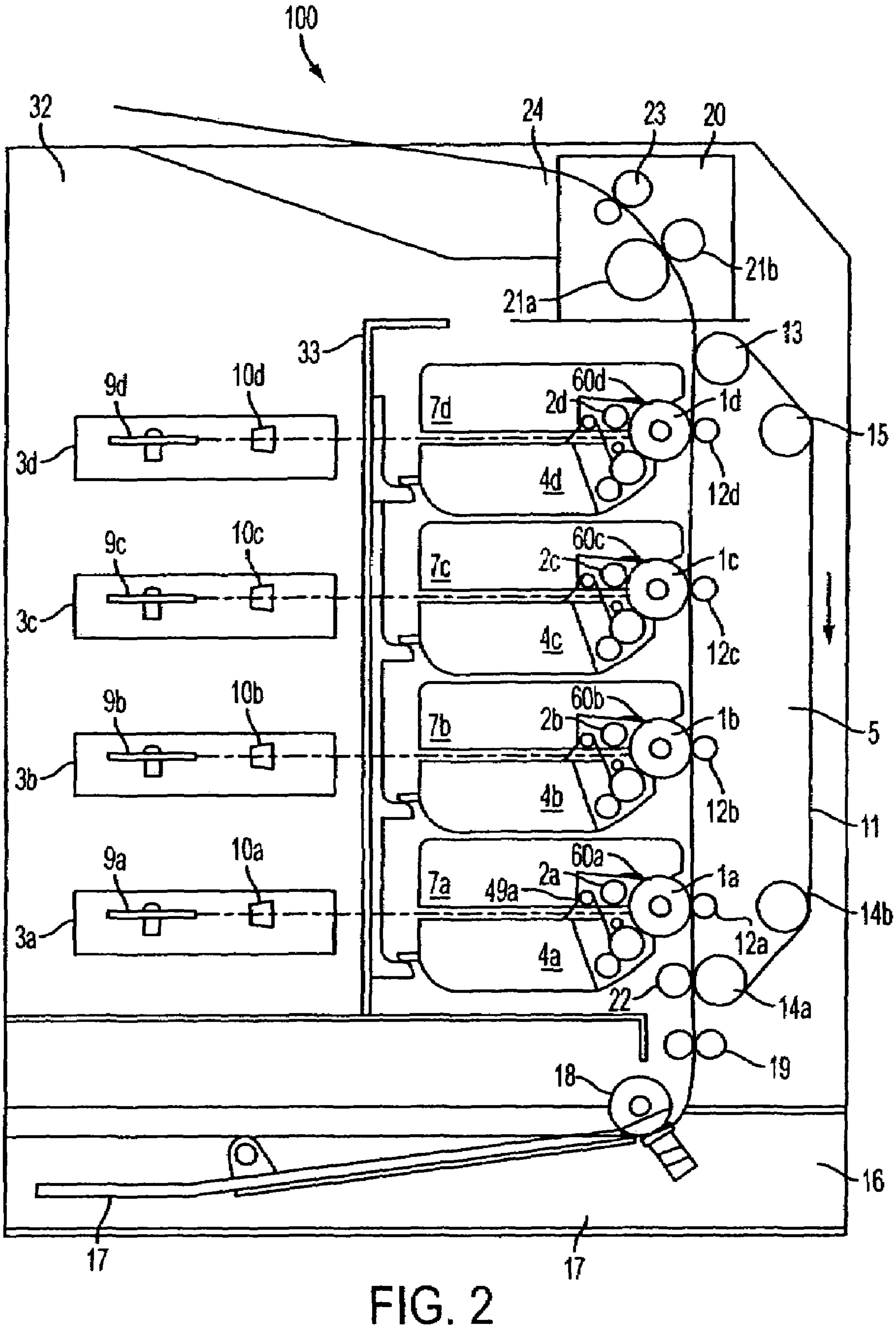
FIG. 2 is a schematic diagram showing the overall construction of an image forming apparatus.

First, the general construction of the image forming apparatus will be schematically described with reference to FIG. 2. The image forming apparatus 100 shown in FIG. 2 is equipped with four photosensitive drums 1*a* through 1*d* serving as the image bearing members arranged side by side in the vertical direction. The photosensitive drums 1*a* through 1*d* are rotated counterclockwise as seen in the drawing by a driving means (not shown).

Respectively arranged around the photosensitive drums 1*a* through 1*d*, successively in the rotating direction thereof, are charging devices 2*a* through 2*d* for uniformly charging the surfaces of the photosensitive drums 1*a* through 1*d*, scanner units 3*a* through 3*d* adapted to apply laser beams based on image information to form electrostatic latent images on the photosensitive drums 1*a* through 1*d*, developing units 4*a* through 4*d* causing toners serving as developers to adhere to the electrostatic latent images to develop them into toner images, an electrostatic transfer device 5 for transferring the toner images on the photosensitive drums 1*a* through 1*d* onto a transfer sheet S, cleaning devices 60*a* through 60*d* for removing residual toner from the surfaces of the photosensitive drums 1*a* through 1*d* after transfer, etc.

The photosensitive drums 1*a* through 1*d*, the charging devices 2*a* through 2*d*, the developing units 4*a* through 4*d*, and the cleaning devices 60*a* through 60*d* are integrated into process cartridges 7*a* through 7*d*.

The photosensitive drums 1*a* through 1*d* consist of aluminum cylinders with a diameter, for example, of 30 mm, to the outer peripheral surfaces of which an organic photoconductor (OPC photosensitive material) is applied. The photosensitive drums 1*a* through 1*d* are rotatably supported at their ends by support members. And, a driving force from a driving motor (not shown) is transmitted to one end of each of the photosensitive drums 1*a* through 1*d*, whereby the photosensitive drums 1*a* through 1*d* are rotated counterclockwise.

Figure 3:
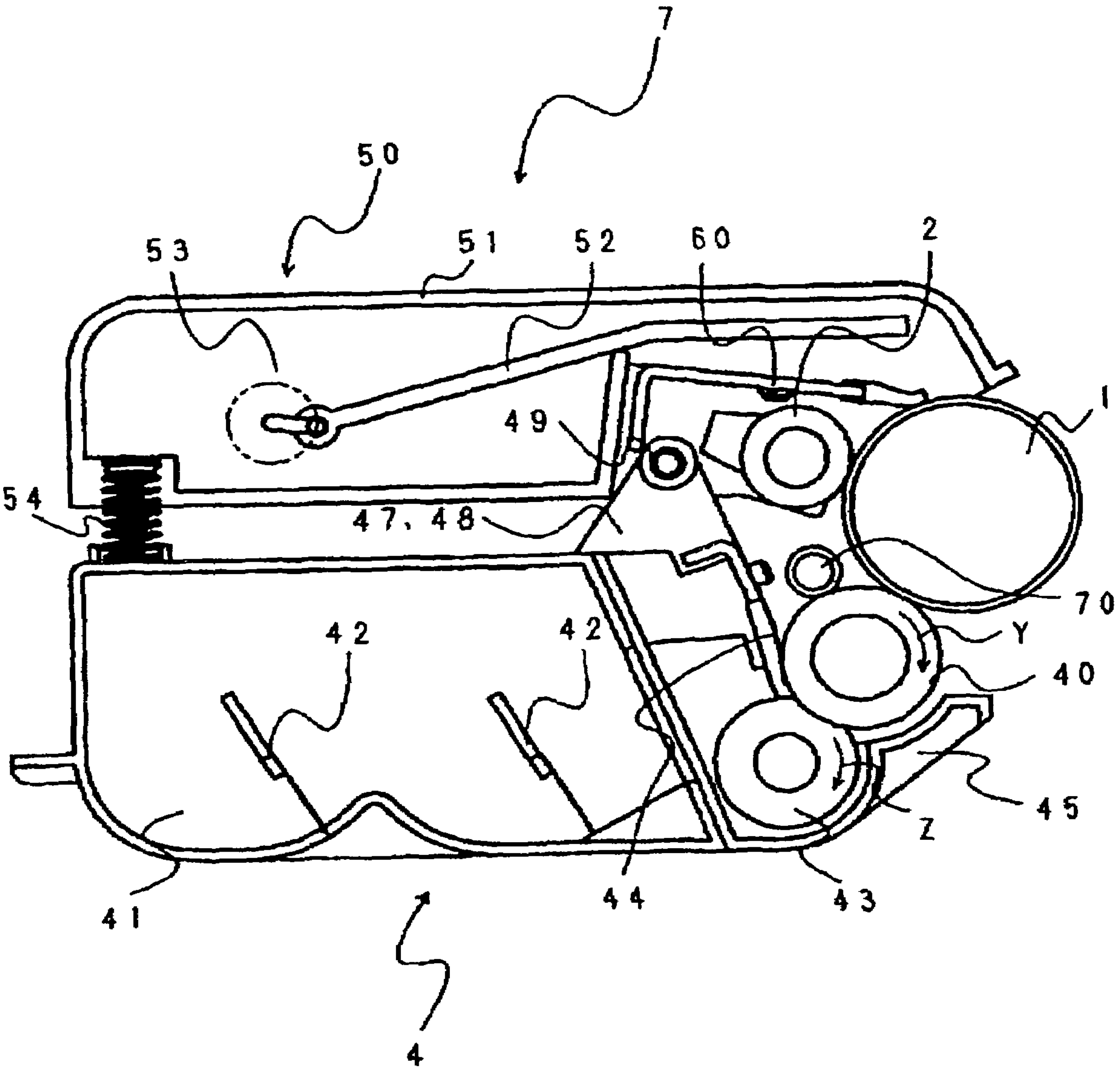
FIG. 3 is an explanatory, longitudinal sectional view of a process cartridge.

The charging device 2 may be of a contact charging type as shown in FIG. 3. In this embodiment, the charging device 2 is constituted of a conductive roller, which is brought into contact with the surface of the photosensitive drum 1 and to which a charging bias voltage is applied, whereby the surface of the photosensitive drum 1 is uniformly charged.

The scanner units 3*a* through 3*d* are arranged substantially in the horizontal extensions of the photosensitive drums 1*a* through 1*d*. Laser diodes (not shown) apply image beams corresponding to image signals to polygon mirrors 9*a* through 9*d* rotated at high speed by scanner motors (not shown). The image beams reflected by the polygon mirrors 9*a* through 9*d* are transmitted through image formation lenses 10*a* through 10*d* to be used for selective exposure of the charged surfaces of the photosensitive drums 1*a* through 1*d* to form electrostatic latent images.

Figure 5:
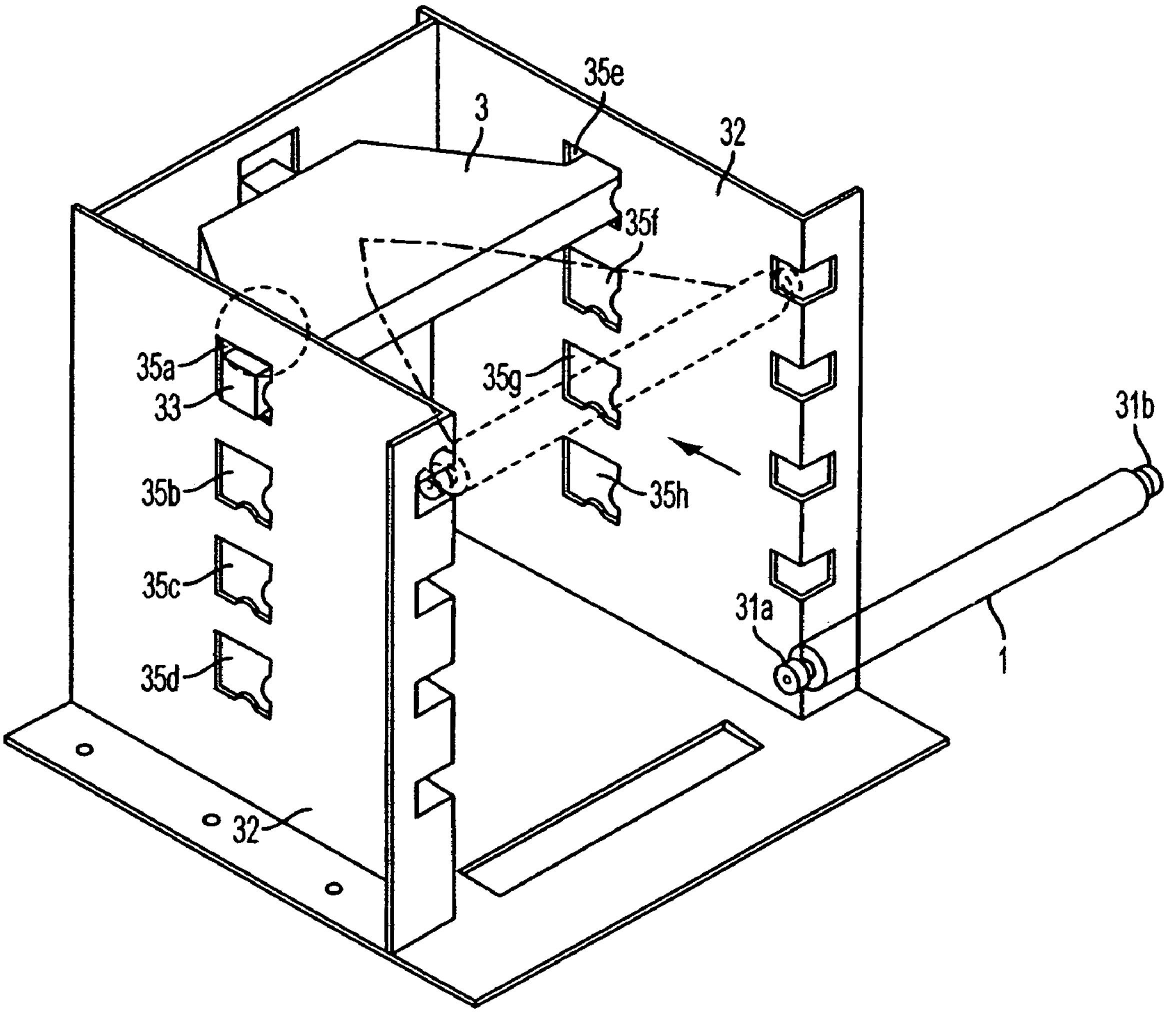
FIG. 5 illustrates how the process cartridge is mounted to the image forming apparatus.
Figure 6:
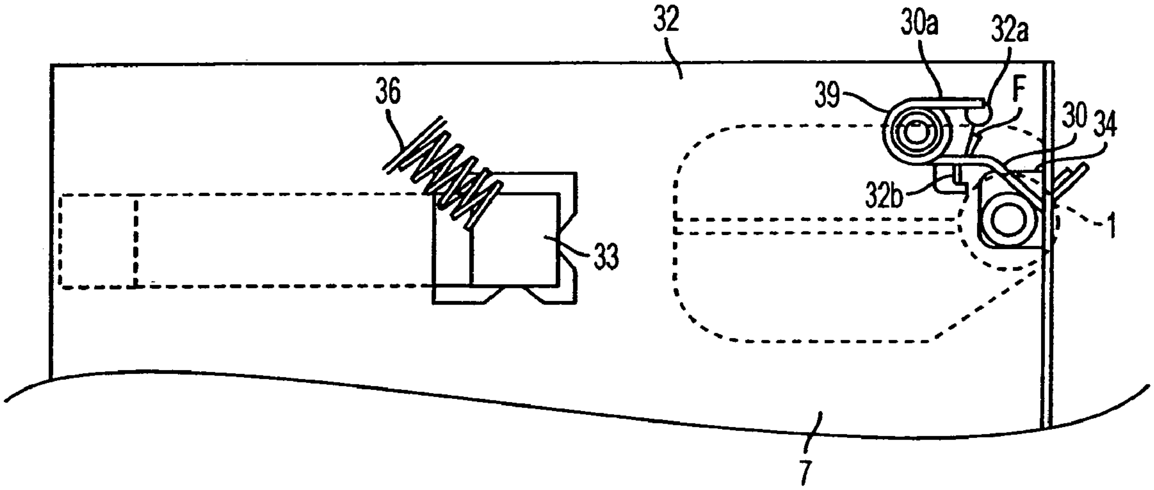
FIG. 6 illustrates how positioning is effected on the process cartridge inside the image forming apparatus.

Further, as shown in FIG. 5, the scanner units 3*a* through 3*d* have a longitudinal dimension larger than the pitch between right and left side plates 32 and are mounted such that their protrusions 33 project outwardly through openings 35*a* through 35*h* of the side plates 32. As shown in FIG. 6, in the mounting process, each scanner unit is pressurized downwardly approximately 45 degrees with a force of approximately 9.8 N by a compression spring 36, whereby the scanner is reliably pressed against the abutment portions of the side plate 32 and positioning is effected thereon.

As shown in FIG. 3, the developing units 4*a* through 4*d* are composed of toner containers 41 respectively containing yellow, magenta, cyan, and black toners and developing frames 45. And, the toner in each of the toner containers 41 is fed to a toner supply roller 43 by a toner feeding mechanism 42. And, the toner is applied to the outer periphery of a developing roller 40 rotating clockwise by a toner supply roller 43 rotating clockwise and a developing blade 44 in press contact with the outer periphery of the developing roller 40.

And, by applying developing bias to the developing roller 40 opposed to the photosensitive drum 1 with a latent image formed thereon, toner development in conformity with the latent image is effected on the photosensitive drum 1 (as will be described in detail below).

As shown in FIG. 2, arranged in the image forming apparatus is an electrostatic transfer belt 11 circulating so as to be opposed to and held in contact with all the photosensitive drums 1*a* through 1*d*. The electrostatic transfer belt 11 is formed of an approximately 150 μm thick film-like member having a volume resistivity of $10^{11}$ to $10^{14}$ Ω·cm. This electrostatic transfer belt 11 is vertically supported by four rollers 13, 15, 14*a*, and 14*b*; its outer peripheral surface on the left-hand side as seen in the drawing electrostatically attracts the transfer sheet S, and circulates so as to bring it into contact with the photosensitive drums 1*a* through 1*d*. In this way, the transfer sheet S is conveyed to transfer positions by the electrostatic transfer belt 11 to undergo toner image transfer from the photosensitive drums 1*a* through 1*d*.

Transfer rollers 12*a* through 12*d* are arranged side by side so as to abut the inner side of the electrostatic transfer belt 11 and to be opposed to the four photosensitive drums 1*a* through 1*d*. A charge of positive polarity is applied from these transfer rollers 12*a* through 12*d* to the transfer sheet S through the electrostatic transfer belt 11. And, due to the electric field formed by this charge, toner images of negative polarity on the photosensitive drums 1*a* through 1*d* are successively transferred to the sheet as it successively comes into contact with the photosensitive drums 1*a* through 1*d*.

The electrostatic transfer belt 11 is constituted of a belt approximately 700 mm round and approximately 150 μm thick. And, the electrostatic transfer belt 11 is stretched between the four rollers of the driving roller 13, the driven rollers 14*a* and 14*b*, and the tension roller 15, and runs in the direction of the arrow in FIG. 2, whereby the above-described electrostatic transfer belt 11 circulates to effect toner image transfer as the transfer sheet S is conveyed from the driven roller 14*a* side to the driving roller 13 side.

A feeding portion 16 feeds the transfer sheet S to the image forming portions and has a feeding cassette 17 containing a plurality of transfer sheets S. When an image is to be formed, a feeding roller 18 (semilunar roller) and a registration roller pair 19 rotate in accordance with the image forming operation. And, the feeding roller 18 feeds one by one the transfer sheets S in the feeding cassette 17. And, the leading edge of each transfer sheet S abuts the registration roller pair 19 to stop temporarily, and, after having formed a loop, is fed to the electrostatic transfer belt 11 by the registration roller pair 19, with the running of the electrostatic transfer belt 11 and the image write position being in synchronism with each other.

A fixing portion 20 serves to fix a toner image in a plurality of colors transferred to the transfer sheet S, and is composed of a fixing roller pair comprising a rotary heating roller 21*a* and a pressurizing roller 21*b* in press contact therewith and adapted to impart heat and pressure to the transfer sheet S. That is, as it passes through the fixing portion 20, the transfer sheet S to which the toner images on the photosensitive drums 1*a* through 1*d* have been transferred is conveyed by the fixing roller pair and receives heat and pressure from the fixing roller pair, whereby a toner image in a plurality of colors is fixed to the surface of the transfer sheet S.

In the image forming operation, the process cartridges 7*a* through 7*d* are successively driven in synchronism with the image formation operation, and, upon their driving, the photosensitive drums 1*a* through 1*d* are rotated counterclockwise. And, the scanner units 3*a* through 3*d* corresponding to the process cartridges 7*a* through 7*d* are successively driven. When the process cartridges are thus driven, the charging devices 2*a* through 2*d* impart uniform charge to the peripheral surfaces of the photosensitive drums 1*a* through 1*d*, and the scanner units 3*a* through 3*d* perform exposure on the peripheral surfaces of the photosensitive drums 1*a* through 1*d* in accordance with image signals to thereby form electrostatic latent images on the peripheral surfaces of the photosensitive drums 1*a* through 1*d*. The developing rollers 40 in the developing units 4*a* through 4*d* transfer toner to the low-potential portions of the electrostatic latent images to thereby form (develop) toner images on the peripheral surfaces of the photosensitive drums 1*a* through 1*d*.

In order that the toner image on the peripheral surface of the photosensitive drum 1*a* may be transferred to a predetermined position on the transfer sheet S, the registration roller pair 19 starts to rotate to feed the transfer sheet S to the electrostatic transfer belt 11. That is, while being held between the electrostatic attraction roller 22 and the electrostatic transfer belt 11, the transfer sheet S is brought into press contact with the outer periphery of the electrostatic transfer belt 11. Further, by applying voltage between the electrostatic transfer belt 11 and the electrostatic attraction roller 22, charge is induced in the dielectric transfer sheet S and the dielectric layer of the electrostatic transfer belt 11, thereby electrostatically attracting the transfer sheet to the outer periphery of the electrostatic transfer belt 11. In this way, the transfer sheet S is attracted to the electrostatic transfer belt 11 in a stable manner, and conveyed to the transfer portion consisting of the photosensitive drum 1*a* and the transfer roller 12*a*.

While the transfer sheet S is being thus conveyed, the toner images on the photosensitive drums 1*a* through 1*d* are successively transferred to the transfer sheet S due to the electric fields formed between the photosensitive drums 1*a* through 1*d* and the transfer rollers 12*a* through 12*d*. The transfer sheet S, to which the toner images in four colors have been transferred, is separated from the electrostatic transfer belt 11 due to the curvature of the driving roller 13, and sent into the fixing portion 20. In the fixing portion 20, the toner image is thermally fixed to the transfer sheet S, which is then discharged with the image face down to the exterior of the main body through a discharge portion 24 by a discharge roller pair 23.

(Process Cartridge)

Figure 4:
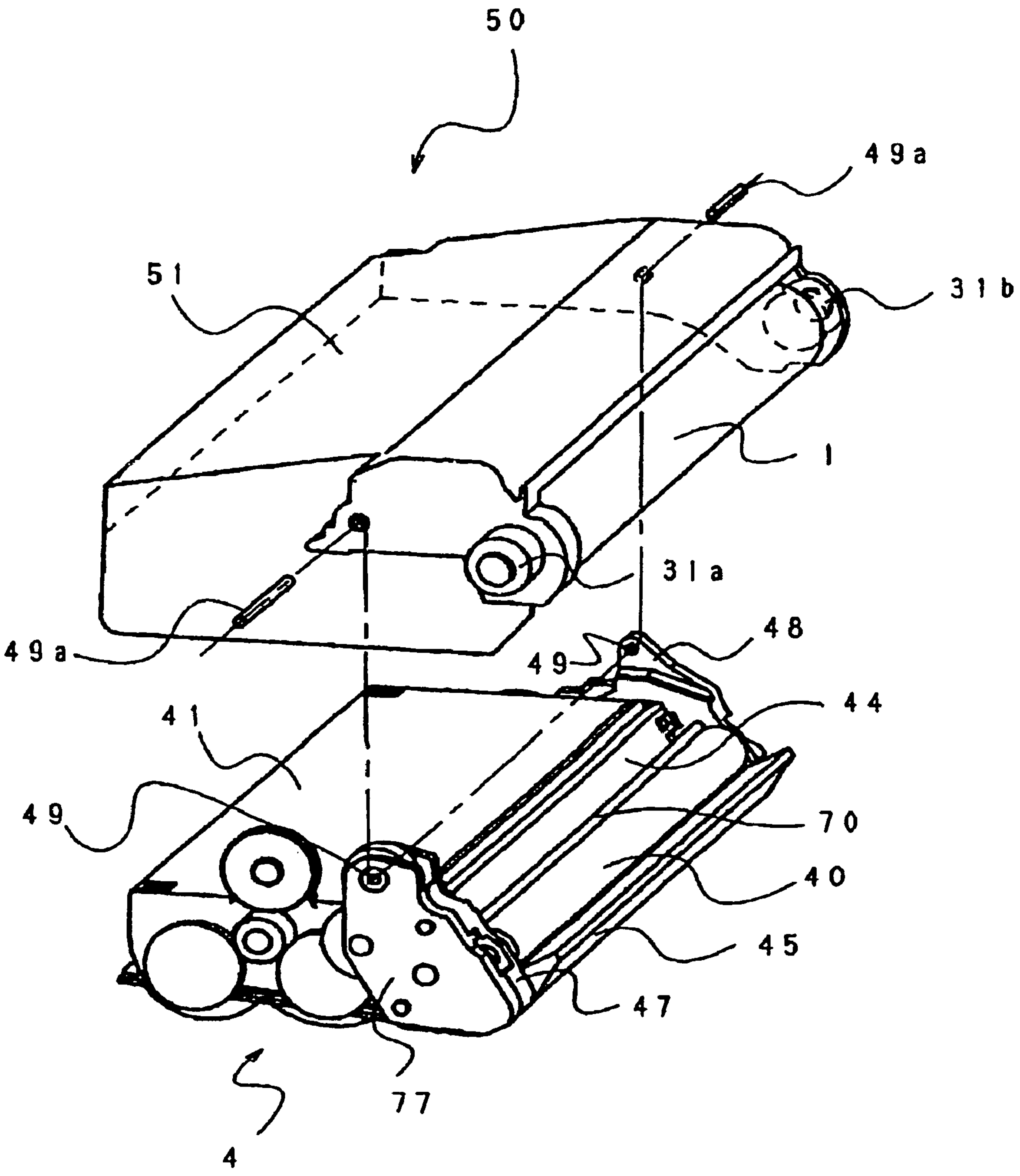
FIG. 4 is an exploded perspective view of the process cartridge.

Next, a process cartridge according to an embodiment of the present invention will be described in detail with reference to FIGS. 3 and 4. FIG. 3 is a longitudinal sectional view of a process cartridge 7 containing toner, and FIG. 4 is an exploded perspective view of the process cartridge 7. Process cartridges 7*a* through 7*d* are of the same construction but respectively contain yellow, magenta, cyan, and black toners.

The process cartridge 7 is composed of an image bearing member unit 50 equipped with a drum-shaped photosensitive member 1 serving as an image bearing member, a charging means, and a cleaning means, and a developing unit 4 having a developing means for developing an electrostatic latent image on the photosensitive drum 1.

In the image bearing member unit 50, the photosensitive drum 1 is rotatably mounted to a cleaning frame member 51 through the intermediation of bearings 31*a* and 31*b*. Arranged around the photosensitive drum 1 are a charging device 2 for uniformly charging the surface of the photosensitive drum 1, and a cleaning blade 60 serving as a cleaning device for removing residual developer (toner) on the photosensitive drum 1. The residual toner removed from the surface of the photosensitive drum 1 by the cleaning blade 60 is successively sent to a waste toner chamber 53 provided at the rear of the cleaning frame member 51 by a toner feeding mechanism 52.

And, by transmitting the driving force of a driving motor (not shown) to the rear end as seen in the drawing, the photosensitive drum 1 is rotated counterclockwise in accordance with an image forming operation.

The developing unit 4 has a developing roller 40 in contact with the photosensitive drum 1 and adapted to rotate in the direction of the arrow Y, a toner container 41 containing toner, and a developing frame member 45. The developing roller 40 is rotatably supported by the developing frame member 45 through the intermediation of retaining members 47 and 48. Further, in the periphery of the developing roller 40, there are arranged a toner supply roller 43 in contact with the developing roller 40 and adapted to rotate in the direction of the arrow Z, and a developing blade 44. Further, in the toner container 41, there is provided a toner feeding mechanism 42 for agitating the toner accommodated in the toner container 41 and feeding the toner to the toner supply roller 43.

And, the developing unit 4 has a suspension structure in which the entire developing unit 4 is supported so as to be capable of oscillating with respect to the image bearing member unit 50 around a support axis 49 by means of pins 49*a* respectively provided in the retaining members 47 and 48 mounted at the ends of the developing unit 4. And, in the state in which the process cartridge 7 is left alone (i.e., in the state in which it is not attached to the printer main body), the developing unit 4 is constantly urged by a pressurizing spring 54 serving as an urging member so as to bring the developing roller 40 into contact with the photosensitive drum 1 due to the rotational moment around the support axis 49.

When development is to be performed, the toner contained in container 41 is fed to the toner supply roller 43 by the toner feeding mechanism 42. And, the toner supply roller 43, rotating in the direction of the arrow Y, is rubbed against the developing roller 40 rotating in the direction of the arrow Z, to thereby supply the toner to the developing roller 40, causing the toner to be borne by the same.

As the developing roller 40 rotates, the toner borne by the developing roller 40 reaches the developing blade 44, which regulates the toner to form a predetermined thin toner layer. As the developing roller 40 rotates, the regulated toner reaches a developer charging roller 70 serving as a developer charging means and is charged to a desired degree. Further, the thin toner layer on the developing roller 40 is fed to the developing portion where the photosensitive drum 1 and the developing roller 40 are in contact with each other. And, in the developing portion, due to DC development bias applied to the developing roller 40 from a power source (not shown), the toner adheres to an electrostatic latent image formed on the surface of the photosensitive drum 1 to thereby develop the latent image.

The portion of the toner left on the surface of the developing roller 40 without contributing to the development is returned to the interior of the developing frame member 45 as the developing roller 40 rotates, and is recovered after being separated from the developing roller 40 at the position where the developing roller 40 and the toner supply roller 43 are rubbed against each other. The recovered toner is mixed through agitation with the residual toner by the toner feeding mechanism 42.

As in this embodiment, in the contact development system, in which the photosensitive drum 1 and the developing roller 40 are held in contact with each other for development, it is desirable that the photosensitive drum 1 be rigid, and that the developing roller 40 be a roller having a resilient portion. The resilient portion may consist, for example, of a monolayer solid rubber or a monolayer of solid rubber coated with resin taking into account the toner charging property.

(Positioning of the Process Cartridge)

Figure 7:
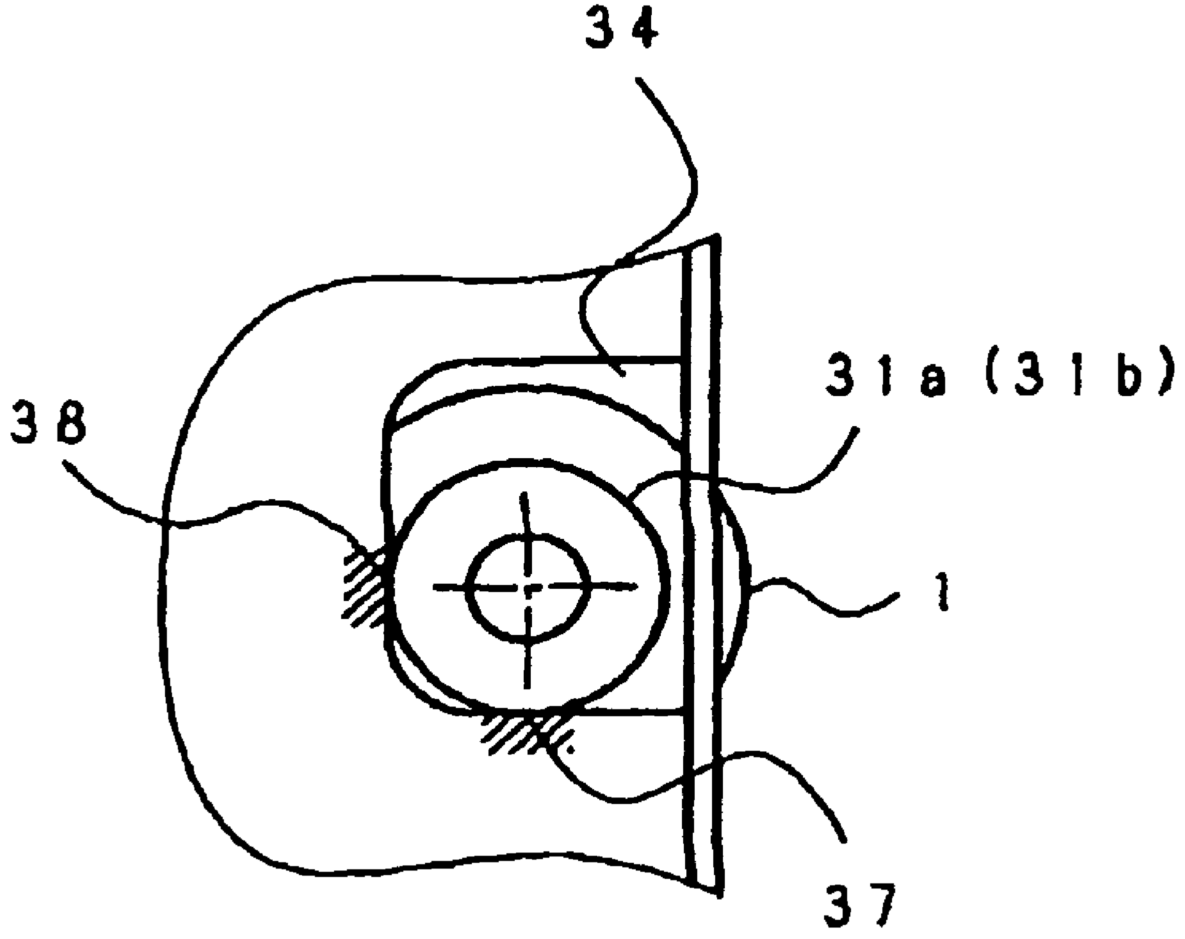
FIG. 7 illustrates bow positioning is effected on the process cartridge inside the image forming apparatus.

As shown in FIG. 5, in attaching the process cartridge 7 to the apparatus main body 100, the bearings 31*a* and 31*b* supporting the photosensitive drum 1 are inserted from the direction of the arrow along the first guide grooves 34. And, as shown in FIG. 7, by pressing the bearings 31*a* and 31*b* against abutment surfaces 37 and 38 of the guide grooves 34, the positioning of the process cartridge 7 is effected.

Inside the printer main body, the process cartridge 7 is pressurized as follows. As shown in FIG. 6, a shaft 39 is crimped to the side plate 32, and a torsion coil spring 30 is supported by the shaft 39, an end portion 30*a* thereof being fitted into the hole 32*a* in the side plate for fixation. In the state in which no process cartridge 7 is attached, the torsion coil spring 30 is regulated in the rotating direction by a raised portion 32*b* of the side plate 32.

The side plate 32 is provided at either end of the apparatus main body 100.

And, when the process cartridge 7 is inserted, the torsion coil spring 30 rotates counterclockwise against its force; when the bearings 31*a* and 31*b* are got over, it is positioned as shown in FIG. 6, exerting a pressurizing force of approximately 9.8 N in the direction of the arrow.

(Developing Device)

Next, the construction of and the mounting method for the developing roller of the developing device, which is a main component of this embodiment of the present invention, and an urging means for the developing roller, will be described with reference to FIGS. 1, and 8 through 11.

Figure 1:
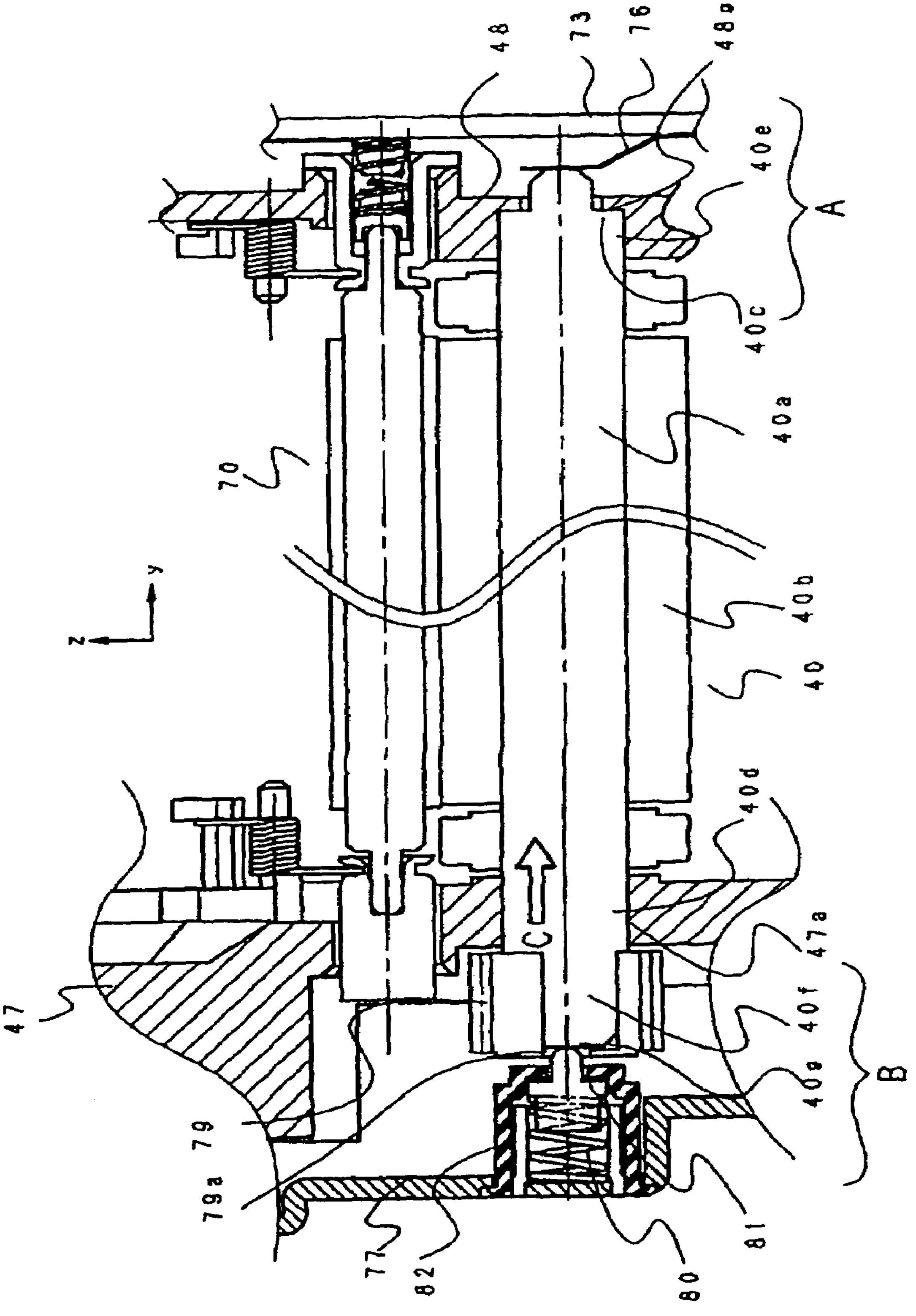
FIG. 1 is a sectional view of a main portion of a developing device according to a first embodiment of the present invention.

As shown in FIG. 1, the developing roller 40 is a conductive roller formed by a metal core 40*a* and a conductive material 40*b*. The core ends 40*d* and 40*e* of the developing roller 40 are rotatably supported by retaining members 47 and 48 constituting the frame member.

The mounting of the developing roller 40 and the retaining members 47 and 48 to the developing container 45 is executed by the following procedures.

Figure 9:
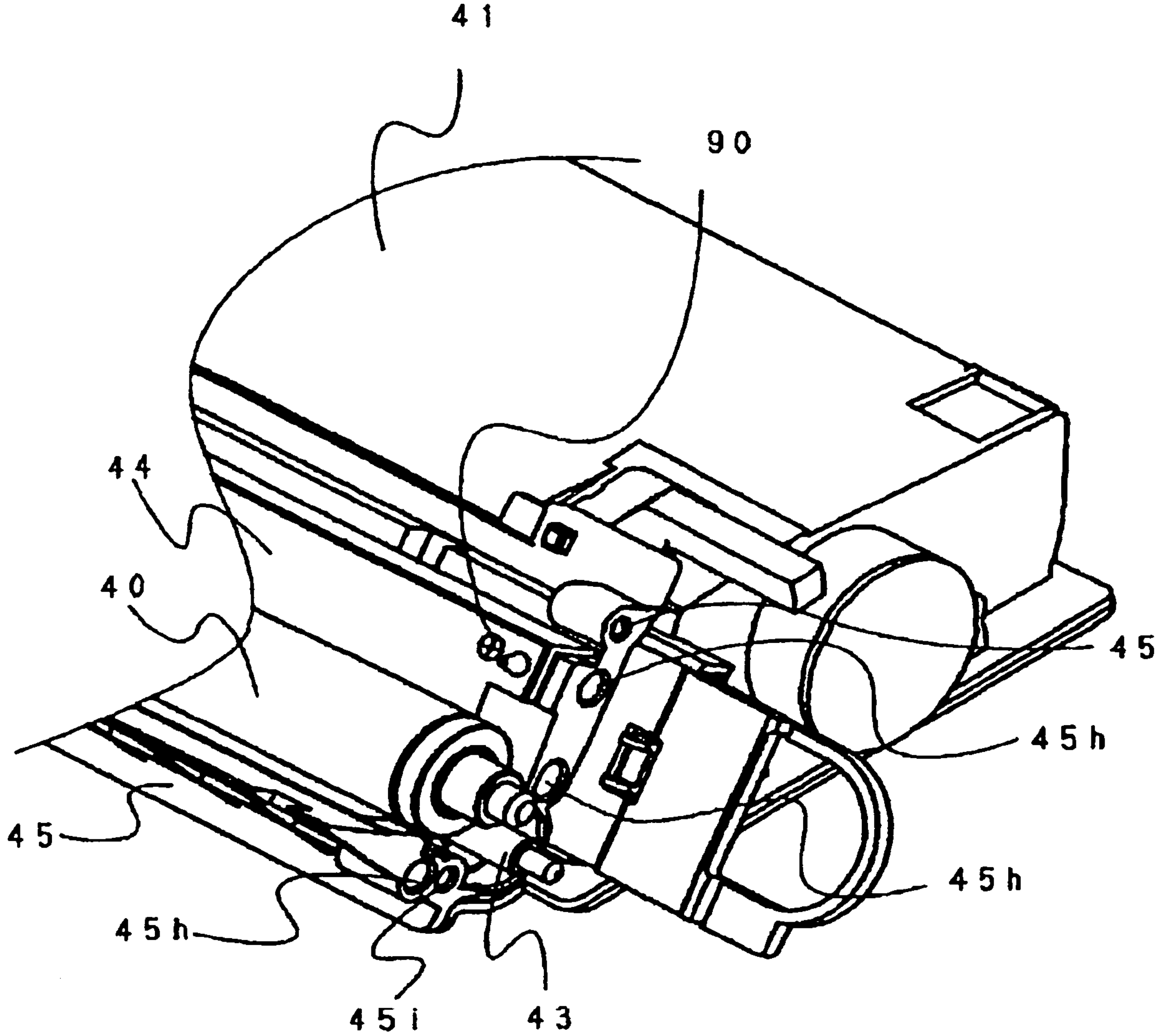
FIG. 9 is a perspective view illustrating how a developing unit is assembled.

As shown in FIG. 9, the toner container 41 is attached to the developing container 45 by thermal welding or the like. Further, the toner supply roller 43 and a seal member (not shown) for preventing leakage of toner to the exterior of the developing container 45 are mounted to the developing container 45. Further, the developing blade 44 is fixed to the developing container 45 by means of a screw 90.

Figure 8:
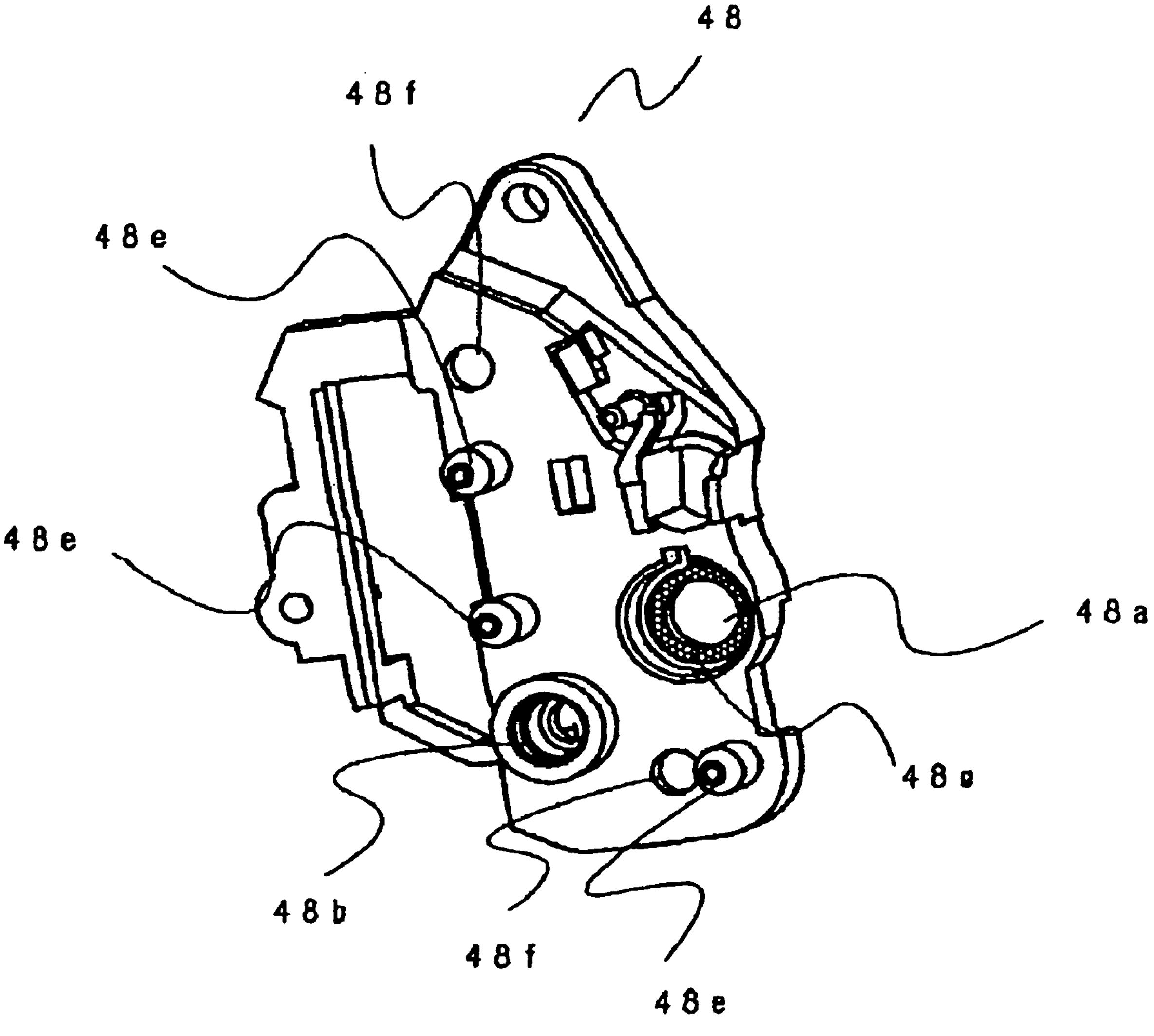
FIG. 8 illustrates the construction of a retaining member.

Provided in a longitudinal side surface of the developing container 45 are holes 45*h* for positioning with respect to the retaining member 48 and lower holes 45*i* for securing the retaining member by screws. As shown in FIG. 8, the retaining member 48 has at positions corresponding to the holes 45*h* provided in the side surface of the developing container 45 positioning bosses 48*e* and holes 48*f* through which screws are to be passed.

The longitudinally opposite side (the side where the retaining member 47 is mounted) of the developing container 45 exhibits the same construction.

As shown in FIG. 9, the developing roller 40 is placed on the developing container 45 with the developing blade 44 mounted thereto. And, to both sides of the developing container 45, the retaining members 47 and 48 are attached in conformity with the positioning holes 45*h*, and the developing roller 40 and the toner supply roller 43 are assembled so as to be mated with the bearing portions 47*a*, 47*b*, 48*a*, and 48*b* of the retaining members 47 and 48 to fix the retaining members 47 and 48 to the developing container 45 by means of screws.

(Details on the Urging Means)

In the following the construction of portion A (the non-drive side of the developing unit) in FIG. 1 will be described.

As shown in FIG. 1, at an end of the developing roller 40, there is provided a regulating portion 40*c* for regulating the developing roller 40 in the thrust direction (the direction of the arrow y in the drawing). At the same time, the retaining member 48 has a regulating portion 48*g* at a position corresponding to the regulating portion of the developing roller 40. In this embodiment, for regulation in the thrust direction, the core 40*a* of the developing roller is equipped with portions with different outer diameters, and the step due to the difference in diameter and a wall surface provided on the developing roller bearing 48*a* of the retaining member 48 are used as the thrust regulating portion for the developing roller (see FIG. 8).

Further, the retaining member 48 has on the outer side a side cover 73, into which a contact plate 76 serving as a means for supplying electricity to the developing roller 40 is incorporated beforehand. Here, the contact plate 76 constitutes a part of the electricity supply path for applying bias from the image forming apparatus main body; electricity supply becomes possible upon incorporation of the developing device into the image forming apparatus (not shown).

In the following, the construction of portion B (the drive side of the developing unit) in FIG. 1 will be described.

The mounting method for the retaining member 47 is the same as that for the non-drive side of the developing unit described above.

As shown in FIG. 1, the retaining member 47 is equipped with a developing roller bearing portion 47*a*. In this embodiment, the bearing portion 47*a* is a through-hole of a fixed diameter. On the drive side, there is play in the thrust direction between the developing roller 40 and the retaining member 47.

Mounted through fitting to the developing roller end portion 40*f* is a helical gear 79 serving as the driving force transmission means for the developing roller 40. Further, the helical gear 79 and the developing roller end portion 40*f* are shaped through D-cut or relieving in order to prevent idle rotation of the helical gear 79. Here, the torsional direction of the helical gear 79 is determined such that the thrust force generated upon application of a driving force is applied in the non-drive-side direction (the direction of the arrow C in the drawing). And, when the developing roller 40 is being driven to rotate, that is, during image formation, the developing roller 40 rotates while undergoing positioning on the non-drive side by the regulating portion 40*c* on the non-drive side described above.

Figure 10:
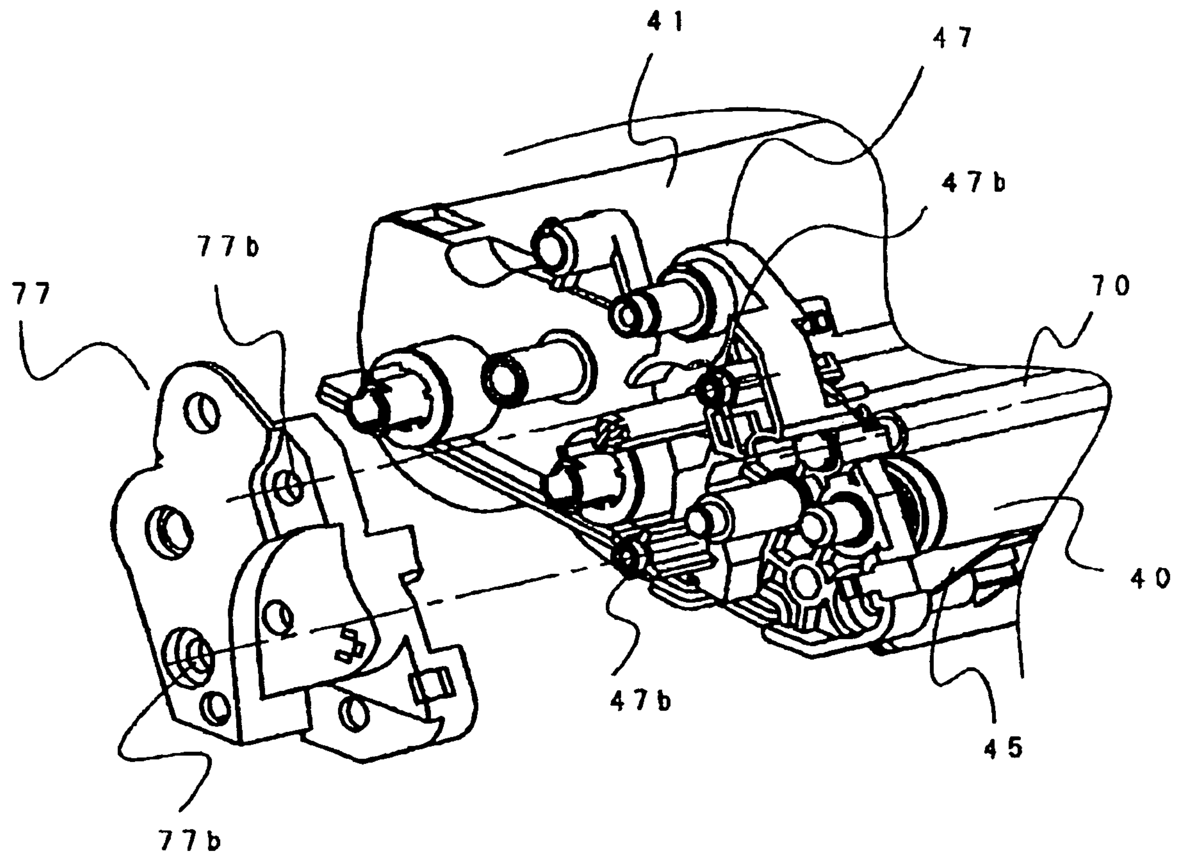
FIG. 10 is a perspective view illustrating how the developing unit is assembled.
Figure 11:
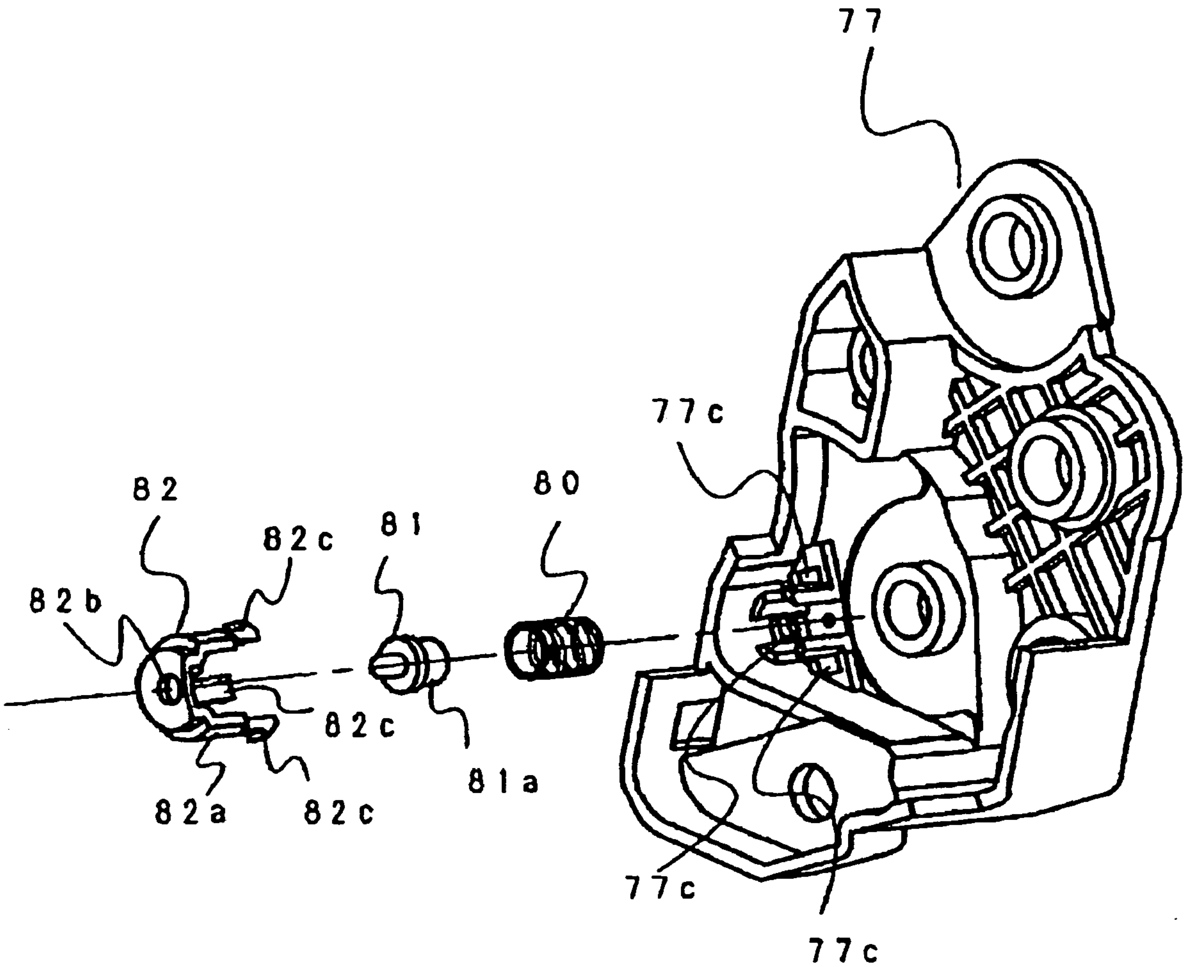
FIG. 11 is an exploded perspective view illustrating how an urging means according to the embodiment of the present invention is assembled.

On the longitudinal outer side of the helical gear 79, a side cover 77 is provided. As shown in FIG. 10, the side cover 77 is mounted by connecting a side cover mounting boss 47*b* of the retaining member 47 and a mounting portion 77*b* of the side cover 77 by a fixing means like a screw. As shown in FIGS. 1 and 11, mounted to the side cover 77 are a pressurizing spring 80 serving as an urging means, a sliding member 81 mounted to a forward end portion of the pressurizing spring and adapted to abut the developing roller core end portion 40*g* and slide thereon, and a spring case 82 for temporarily attaching the pressurizing spring 80 and the sliding member 81 to the side cover 77.

The side cover 77, the pressurizing spring 80, the sliding member 81, and the spring case 82 are assembled by the following procedures (See FIG. 11).

First, the sliding member 81 is fitted to the pressurizing spring 80. The sliding member 81 is a member formed of a resin material having slidability (such as POM), and has a fitting or abutment portion 81*a* with a diameter slightly larger than the inner diameter of the pressurizing spring 80. By fitting the pressurizing spring 80 into this fitting portion 81*a*, it is possible to handle the pressurizing spring 80 and the sliding member 81 integrally.

The spring case 82 is a member formed of a resin material (PS, POM, ABS or the like), and has an inner diameter larger than the outer diameter of the pressurizing spring 80 so as not to hinder the expansion and contraction of the pressurizing spring 80. Further, the spring case 82 is equipped with a wall portion 82*a*, surrounding the abutment portion 81*a* allowing the sliding member 81 to abut against and slide on the developing roller 40, and a hole 82*b*. Thus, the sliding member 81 is always joined to a portion near the rotation shaft center of the developing roller core end portion 40*g*.

Subsequently, an integral unit consisting of the pressurizing spring 80 and the sliding member 81 is fitted into the spring case 82. In this embodiment, the side cover 77 is equipped with a hole 77*c*, and the spring case 82 is equipped with a snap-fit-shaped portion 82*c*, the mounting being completed through their engagement.

Further, the central axes of the spring case 82, the pressurizing spring 80, and the sliding member 81 are substantially matched with the rotation shaft center of the developing roller 40.

By mounting the side cover 77 assembled by the above procedures to the retaining member 47, the sliding member 81 abuts the developing roller core end portion 40*g* to urge the developing roller 40.

Here, a round hole 79*a* is provided in the portion of the end surface of the helical gear near the developing roller shaft center, and the sliding member 81 directly urges the developing roller core end portion 40*g*. The reason for taking this measure is as follows. In this embodiment, the helical gear 79 is formed of a resin material having slidability, so that it is necessary to prevent heat generation when the gear and the sliding member 81 are rubbed against each other, which leads to their wear. Further, when the sliding member 81 directly urges the developing roller 40, it is possible to restrain a variation in the urging force due to building-up of a dimensional tolerance.

Further, the spring force of the pressurizing spring 80 is larger than the abutment force of the contact plate 76, and not less than double the weight X (g) of the developing roller. That is, it is not less than 0.0196 X (N). This value is determined based on actual measurement of the value of impact applied to the developing roller 40 due to the vibration during transportation.

In this embodiment, the weight of the developing roller 40 is 150 g, and the spring force of the pressurizing spring 80 is set at not less than 3.43 N. In this embodiment, the abutment force of the contact plate 76 is approximately 1.47 N, so that the spring force of the pressurizing spring 80 is larger than the spring force of the contact plate 76.

Due to this arrangement, even if a vibration in the longitudinal direction of the developing roller is applied to the process cartridge 7, the positional relationship between the developing roller 40, the developing container 45, and the developing blade 44 is always maintained, making it possible to prevent deformation of the developing roller when the developing roller 40 moves in the thrust direction to be rubbed against the developing blade 44. Further, even when no driving force is being applied to the developing roller 40, the developing roller 40 is always pressurized by the developing roller longitudinal regulating portion 48*g* of the retaining member 48 to be thereby stabilized in position. Further, even immediately after the drive input to the developing roller 40, the abutment pressure for the developing roller contact point is secured, making it possible to supply bias in a stable manner.

Further, the forward end portion of the sliding member 81 has a spherical configuration or the area of the surface portion thereof coming into contact with the developing roller 40 is small, whereby even when urging is effected on the developing roller 40 by the urging means, the load torque generated at the portion where the sliding member 81 slides on the developing roller core end portion 40*g* is very small, and does not adversely affect the requisite motor output necessary for driving the developing device.

(Second Embodiment)

Figure 12:
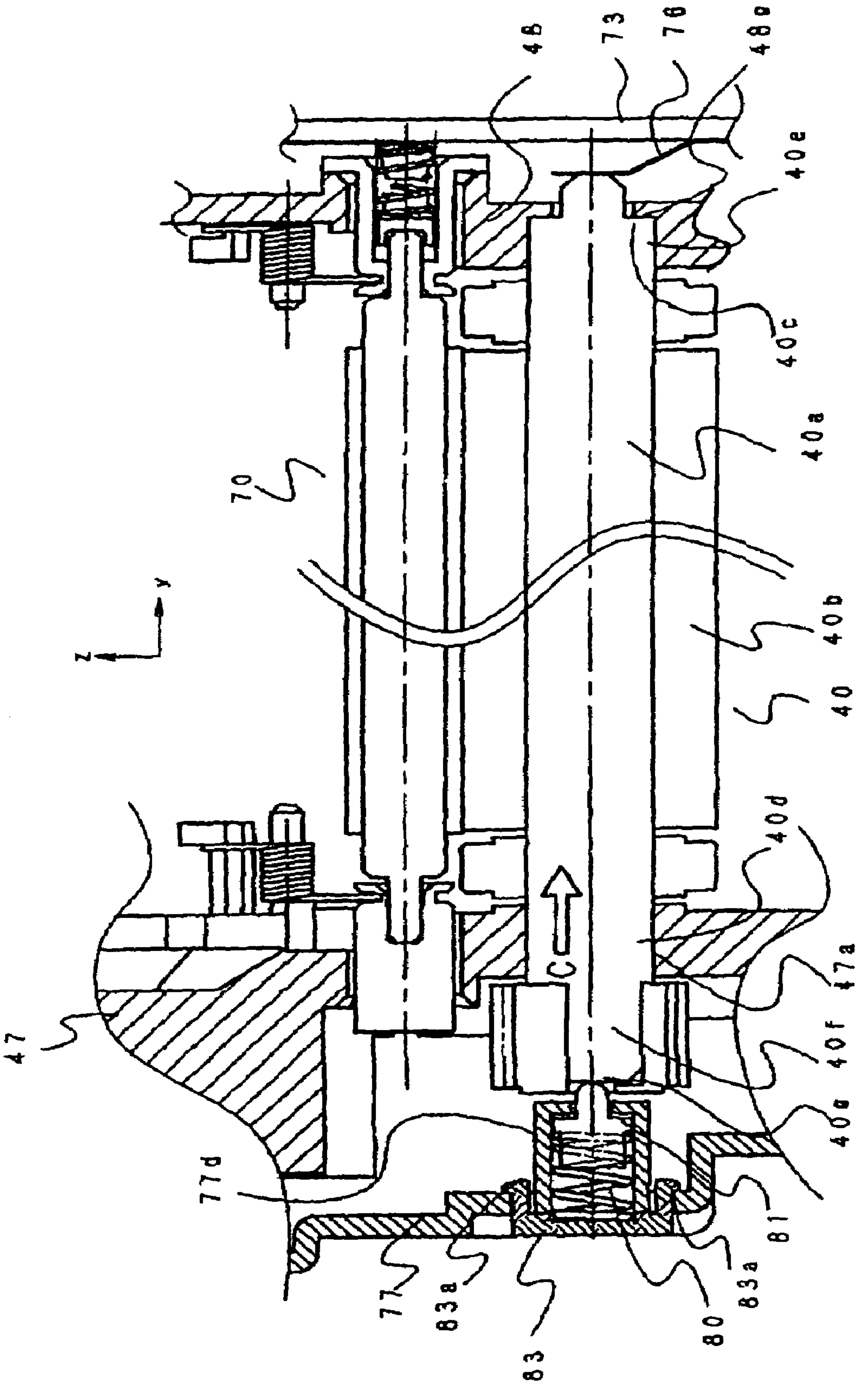
FIG. 12 is a main-portion sectional view of a second embodiment of the present invention.
Figure 13:
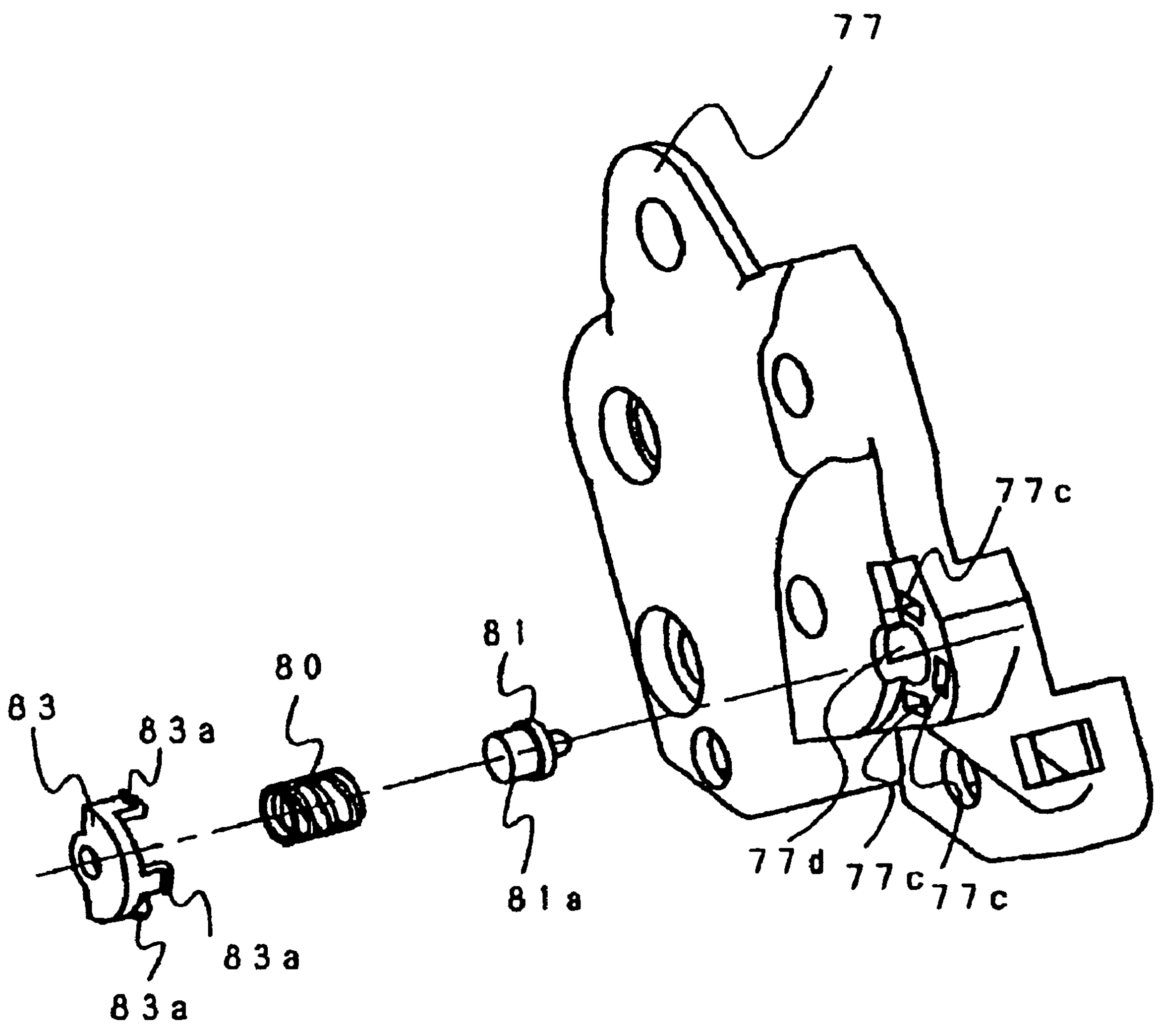
FIG. 13 is an exploded perspective view of the second embodiment of the present invention.
Figure 14:
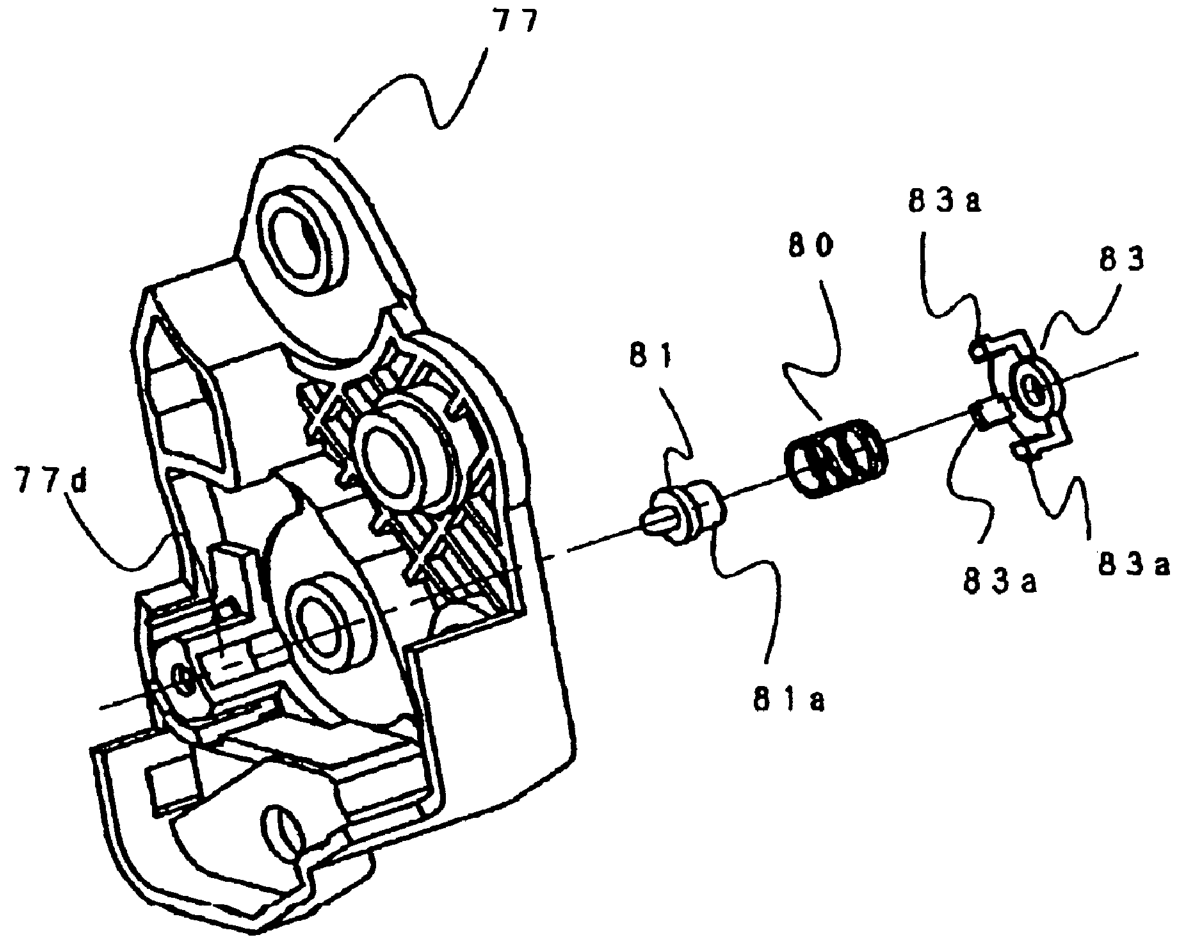
FIG. 14 is an exploded perspective view of the second embodiment of the present invention.

FIGS. 12 through 14 show a second embodiment of the present invention. The general construction of the image forming apparatus is the same as that of the first embodiment described above. The following description will focus on the features of the second embodiment, and a description of the components which are the same as those of the first embodiment will be omitted as appropriate.

(Construction of the Process Cartridge)

The general construction of the cleaning unit and the developing unit is the same as that of the first embodiment.

(Details on the Urging Means)

FIGS. 12 through 14 show the urging means of this embodiment in detail. The constructions of the developing roller 40 and the retaining members 47 and 48 are the same as those of the first embodiment.

As shown in FIGS. 12 through 14, the side cover 77 is equipped with a cylindrical portion 77*d* for mounting the pressurizing spring 80 and the sliding member 81 from the outside with respect to the longitudinal direction of the developing roller 40. This cylindrical portion 77*d* has an inner diameter larger than the outer diameter of the pressurizing spring 80 and the outer diameter of the sliding member 81, so that it does not hinder the expansion and contraction of the pressurizing spring 80 and the movement of the sliding member 81.

Further, a cap member 83 for retaining the pressurizing spring 80 is mounted to the outer side surface of the side cover 77.

The side cover 77, the pressurizing spring 80, the sliding member 81, and the cap member 83 are assembled by the following procedures.

The procedure for attaching the sliding member 81 to the pressurizing spring 80 is the same as that in the first embodiment.

Next, the integral unit consisting of the pressurizing spring 80 and the sliding member 81 is incorporated into the cylindrical portion 77*d* of the side cover 77.

Thereafter, the cap member 83 is mounted to the side cover 77. The cap member 83 is equipped with a snap-fit-shaped portion 83*a*, and the side cover 77 is equipped with a hole 77*c*. The mounting is completed through their engagement.

By mounting the side cover 77 assembled by the above procedures to the retaining member 47, the sliding member 81 abuts the developing roller core end portion 40*g* to urge the developing roller 40.

In this embodiment, it is possible to reverse the procedure for attaching the side cover 77 to the retaining member 47 and the procedure for mounting the pressurizing spring 80, the sliding member 81, and the cap member 83 to the side cover 77.

The load of the pressurizing spring 80, the forward end configuration of the sliding member 81, etc., are the same as those of the first embodiment described above.

(Third Embodiment)

Figure 15:
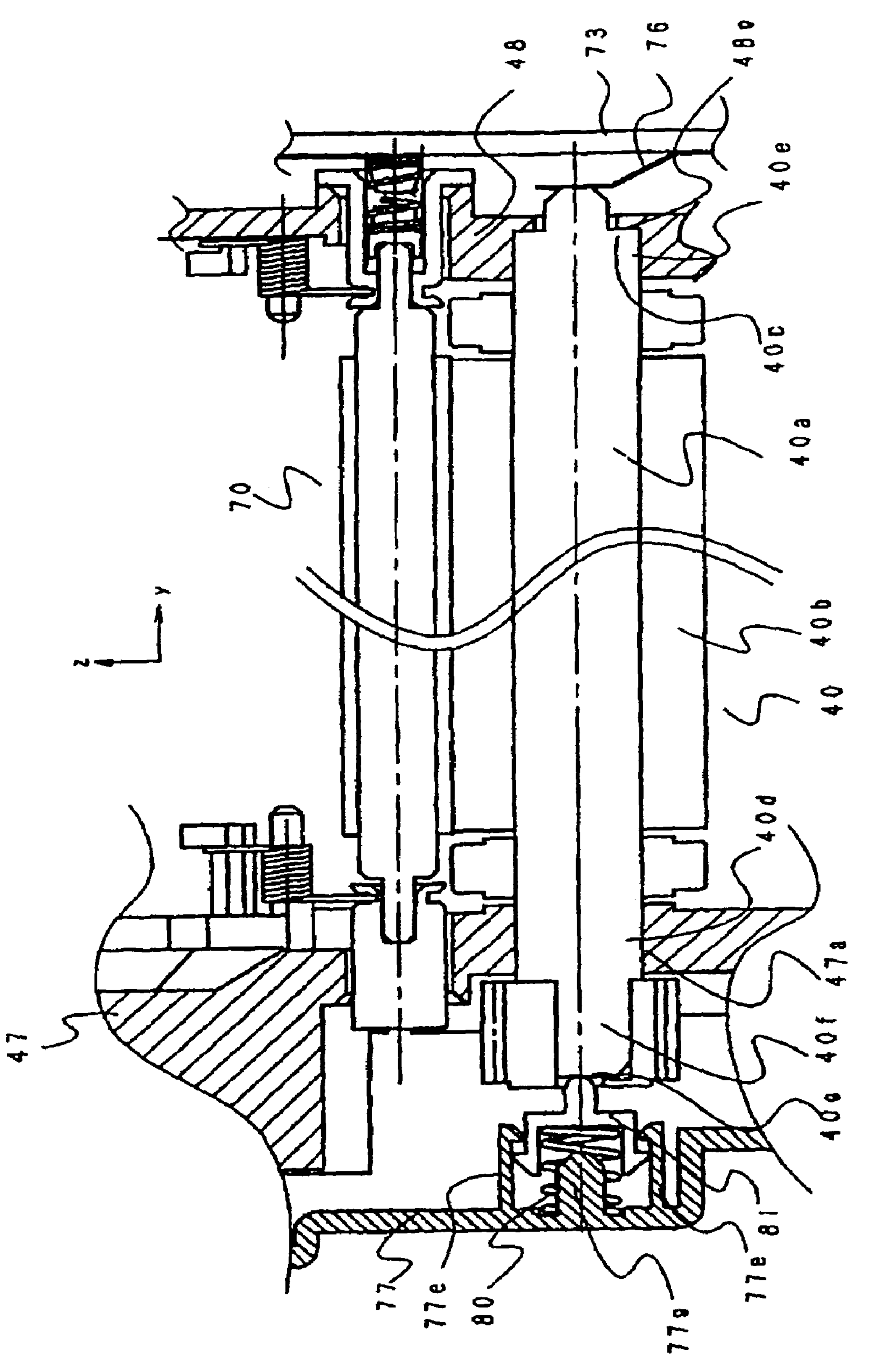
FIG. 15 is a main-portion sectional view of a third embodiment of the present invention.
Figure 16:
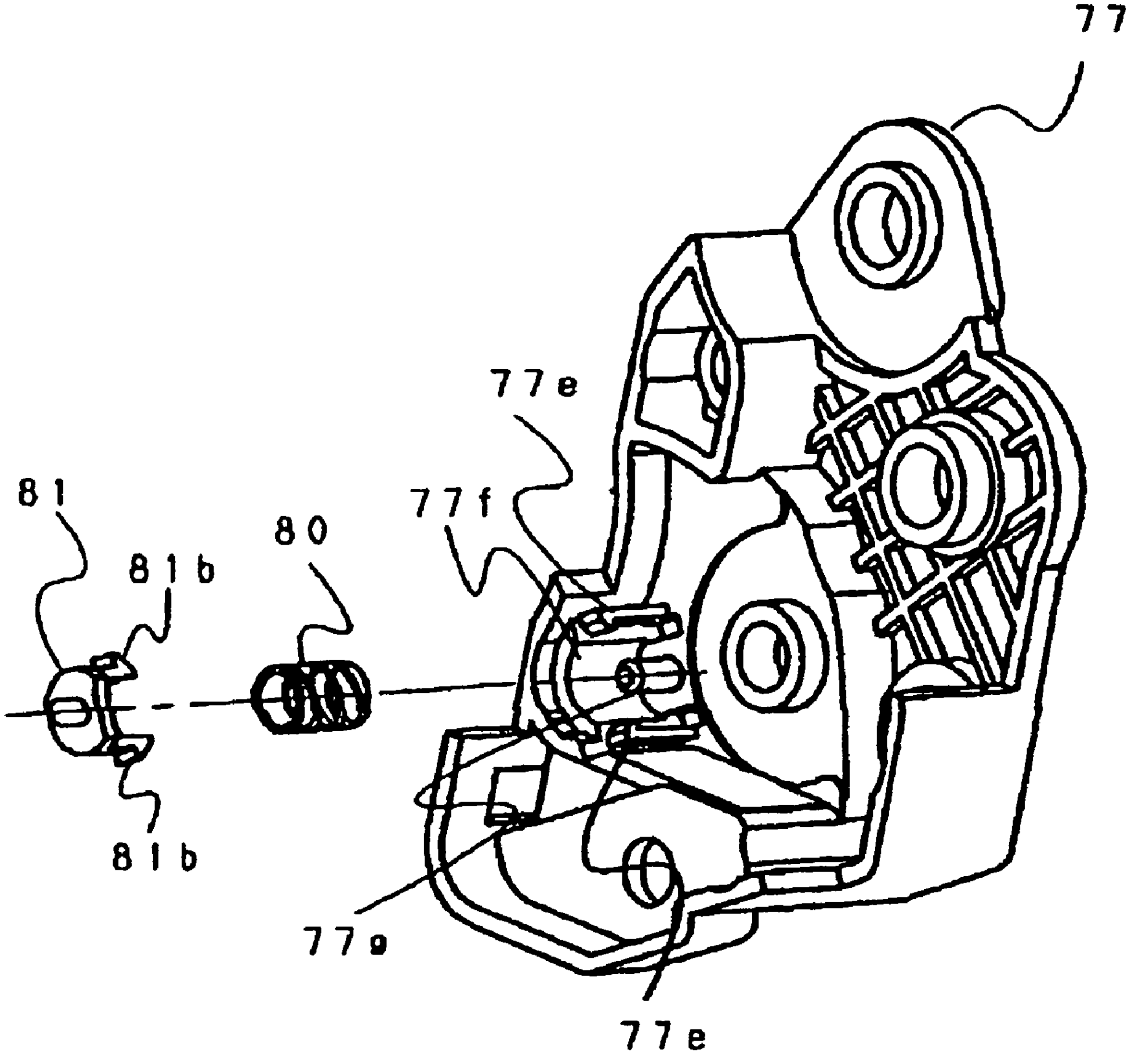
FIG. 16 is an exploded perspective view of the third embodiment of the present invention.
Figure 17:
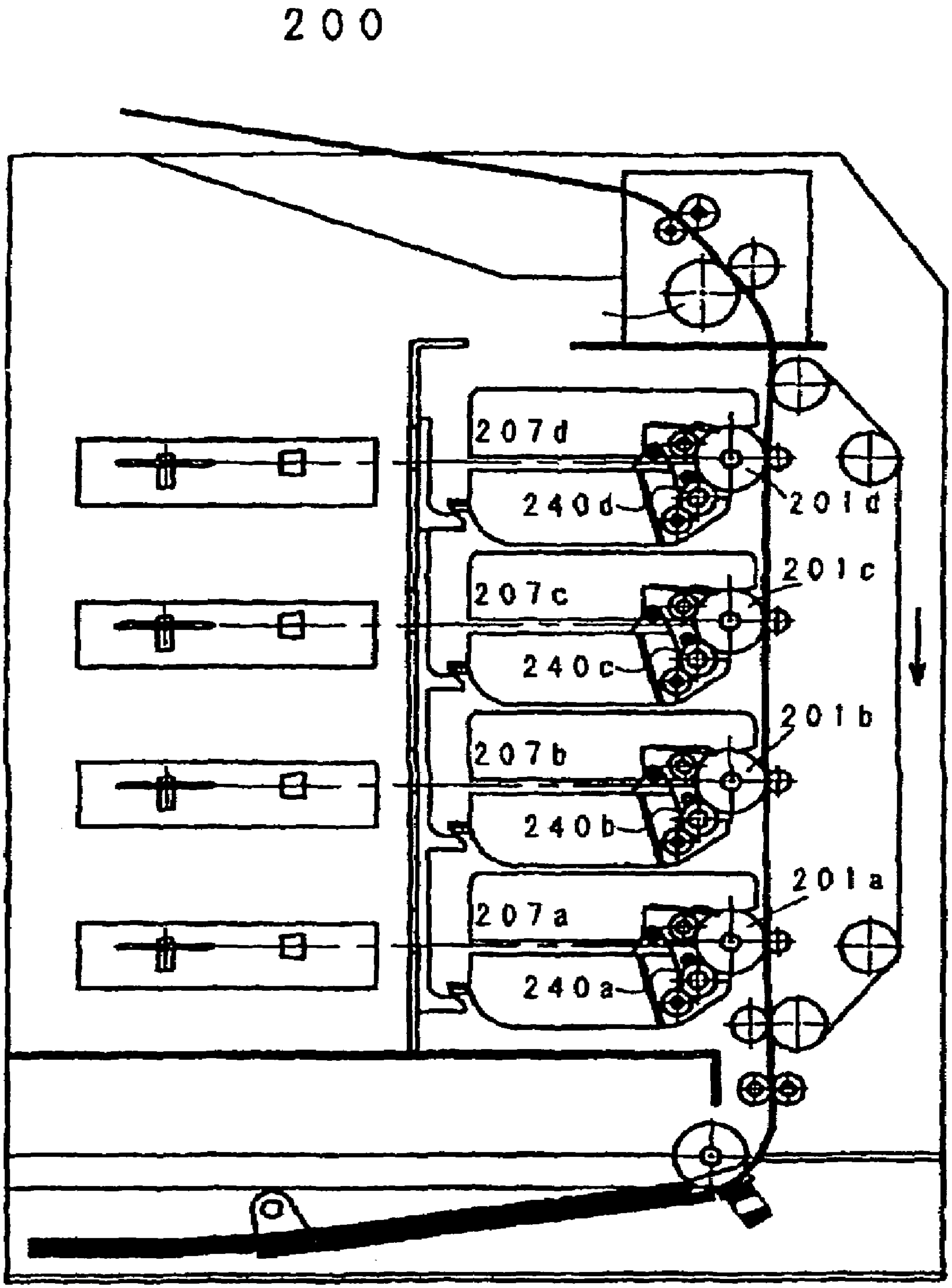
FIG. 17 is a general schematic diagram illustrating a conventional image forming apparatus.
Figure 18:
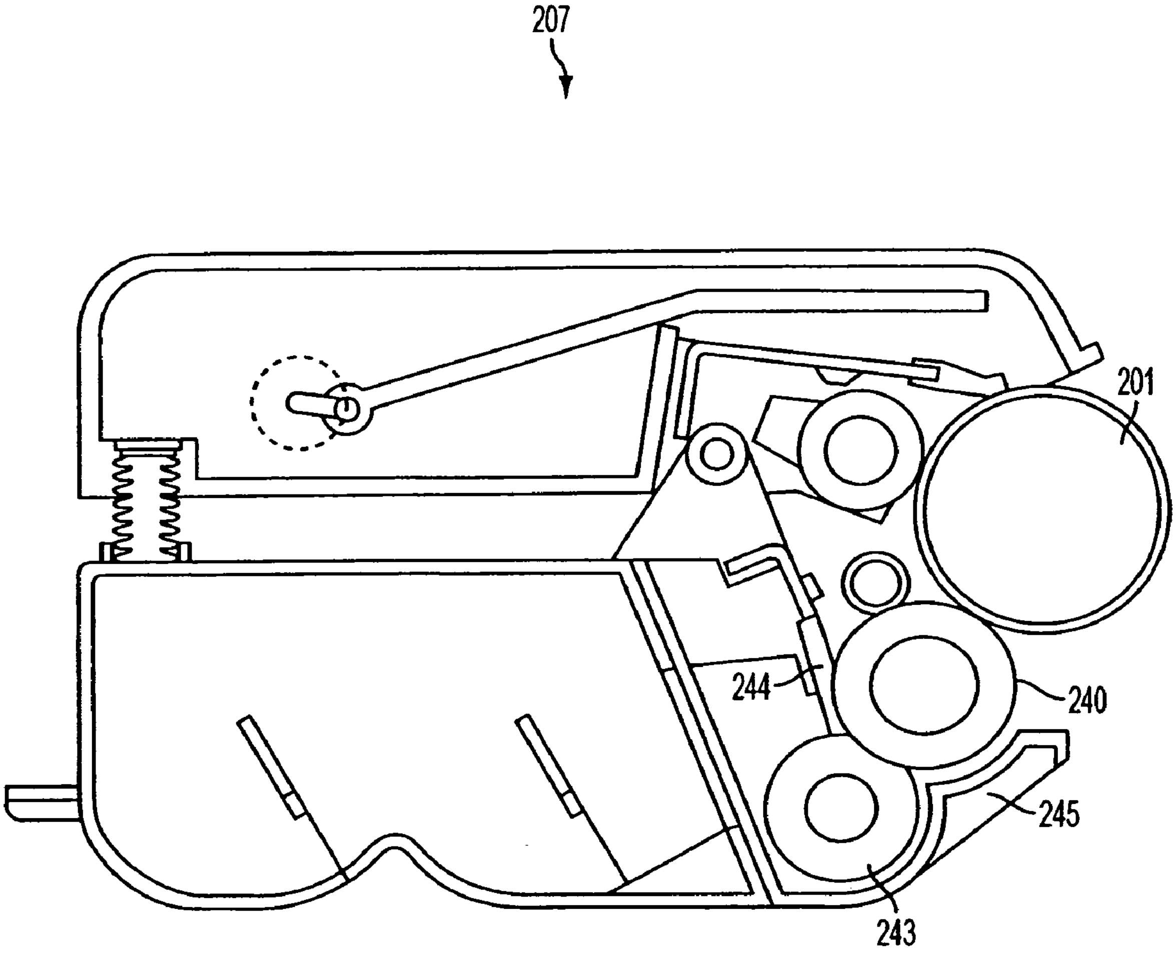
FIG. 18 is a sectional view illustrating a conventional developing device.
Figure 19:
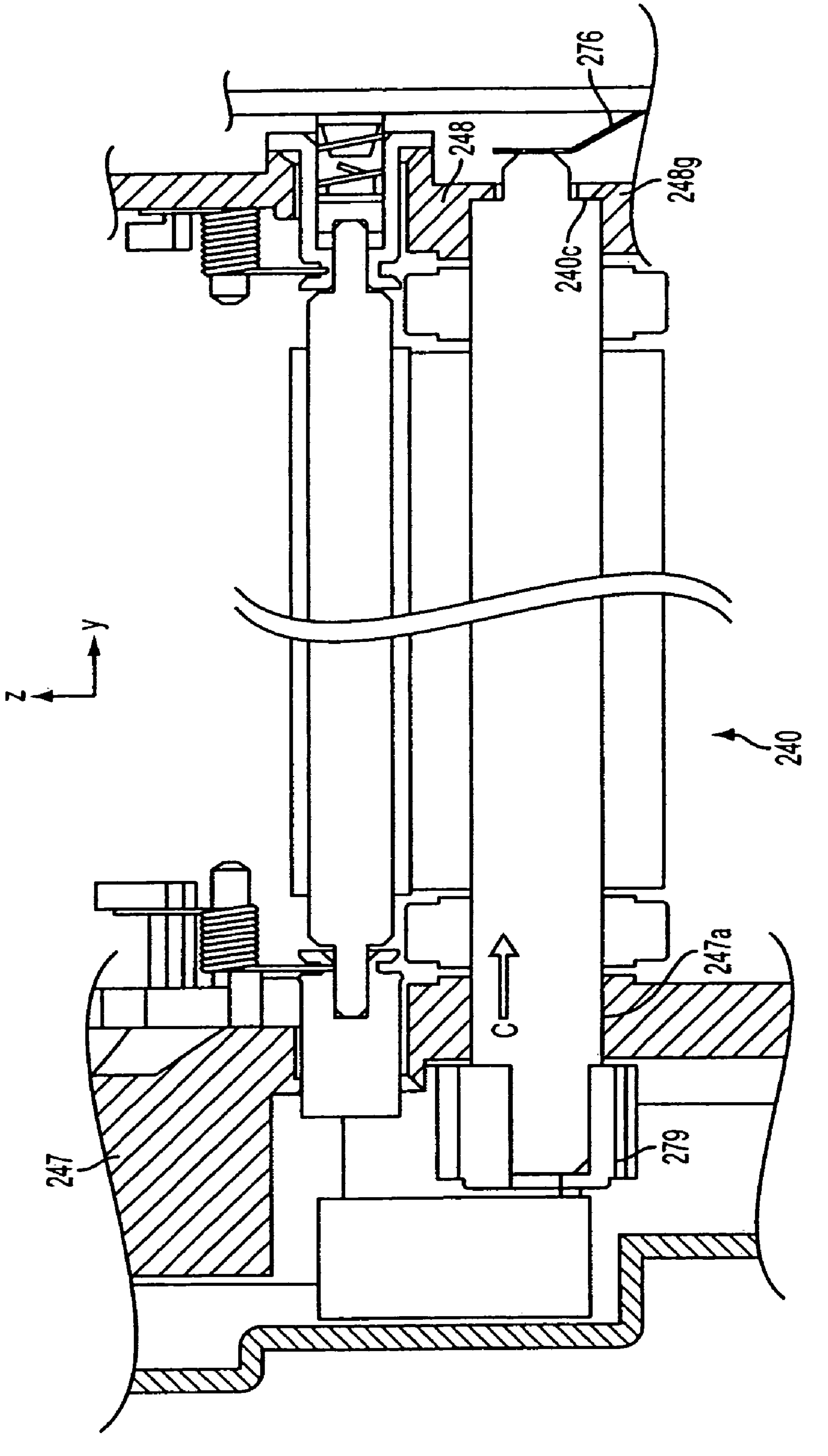
FIG. 19 is a main-portion sectional view illustrating the conventional developing device.

FIGS. 15 and 16 show a third embodiment of the present invention. The general construction of the image forming apparatus is the same as that of the first embodiment described above. The following description will focus on the features of the third embodiment, and a description of the components which are the same as those of the first embodiment will be omitted as appropriate.

(Construction of the Process Cartridge)

The general construction of the cleaning unit and the developing unit is the same as that of the first embodiment.

(Details on the Urging Means)

FIGS. 15 and 16 show the urging means of this embodiment in detail. The constructions of the developing roller 40 and the retaining member 47 are the same as those of the first embodiment.

As shown in FIGS. 15 and 16, the side cover 77 is equipped with a retaining portion 77*e* for retaining the sliding member 81. Around the retaining portion 77*e*, there is provided a guide wall 77*f* having a diameter larger than the outer diameter of the sliding member 81. Further, a guide pin 77*g* is provided in the portion of the side cover 77 where the pressurizing spring 80 is mounted. Further, the sliding member 81 is equipped with a claw portion 81*b* to be engaged with the retaining portion 77*e* of the side cover 77.

The mounting of the pressurizing spring 80 and the sliding member 81 to the side cover 77 is conducted by the following procedures.

The pressurizing spring 80 is temporarily fitted onto the guide pin 77*g* provided on the side cover 77. Thereafter, the sliding member 81 is fitted into the side cover 77 while guiding the pressurizing spring 80 by the interior of the sliding member 81. The sliding member 81 is pushed in until its claw portion 81*b* passes the retaining portion 77*e* of the side cover 77, thereby engaging the claw portion 81*b* with the retaining portion 77*e*, whereby the mounting of the sliding member 81 and the pressurizing spring 80 to the side cover 77 is completed.

By mounting the side cover 77 assembled by the above procedures to the retaining member 47, the sliding member 81 abuts the developing roller core end portion 40*g* to urge the developing roller 40.

The load of the pressurizing spring 80, the forward end configuration of the sliding member 81, etc. are the same as those of the first embodiment described above.

(Other Embodiments)

While in the above-described embodiments the present invention is applied to a process cartridge having a developing device according to an embodiment of the present invention and an image forming apparatus to which this process cartridge is detachably attached, this should not be construed restrictively. The present invention provides the same advantages if applied to a developing device installed in an image forming apparatus, a developing cartridge of which the developing device alone is detachable, etc.

As described above, in accordance with the embodiments described above, the developing roller core portion is urged by an urging means superior in assembly property, always keeping the developing roller at the regulated position. Due to this arrangement, the positional relationship between the developing roller and the developing blade can be fixed even under vibration, etc., applied mainly during transportation, thereby preventing rubbing between them and preventing an image deficiency. Further, by fixing the positional relationship between the developing roller and the contact member, it is always possible to make the contact pressure applied to the developing roller constant. Thus, it is possible to prevent the contact pressure from becoming unstable immediately after a start operation.

Thus, as described above, in accordance with the present invention, there is provided an urging means provided in the frame body and adapted to urge the developing roller in the axial direction, wherein when a driving force is transmitted to the developing roller, the developing roller is urged by the thrust force of the helical gear in the same direction in which the developing roller moves, whereby it is always possible to make the position of the developing roller in the thrust direction constant. Further, not only during image formation, transportation, and the attachment of a developing device, a developing cartridge, and a process cartridge to the image formation apparatus, it is always possible to make the positional relationship of the developing roller in the thrust direction constant, thereby always making the positional relationship in the thrust direction between the developing roller and the electrophotographic photosensitive member constant. Thus, it is possible to prevent deformation of the resilient member of the developing roller due to movement of the developing roller in the thrust direction.

Further, in the developing device having a developing blade, the developing cartridge, and the process cartridge, it is always possible to make the positional relationship in the thrust direction between the developing roller and the developing blade constant.

Further, according to another aspect of the present invention, it is always possible to stabilize the contact between the electrical contact for supplying development bias to the developing roller from the image forming apparatus main body and the developing roller.

Further, according to still another aspect of the present invention, due to the provision of the urging means in the side cover, the assembly is facilitated.

What is claimed is:

1. A developing device installable in an image forming apparatus having one end and another end, comprising:

a developing roller supported by said developing device and adapted to develop a latent image formed on an electrophotographic photosensitive member;

a developing blade adapted to regulate the thickness of a toner layer on said developing roller and provided so as to be in contact with said developing roller;

a helical gear provided at one end of said developing roller in an axial direction thereof and adapted to transmit a driving force to said developing roller;

a regulating portion provided at the another end of said developing device in the axial direction thereof so as to maintain the position of said developing roller in the axial direction thereof;

urging means, which is provided at the one end of said developing device in the axial direction thereof, for urging said developing roller toward said regulating portion, and for urging said developing roller toward said regulating portion so as to maintain the position of said developing roller, wherein said urging means urges said developing roller in the same direction as a direction in which said helical gear urges said developing roller when the driving force is transmitted to said developing roller, wherein the urging force of said urging means is not less than double the weight of said developing roller.

2. A developing device according to claim 1, wherein said developing roller has a elastic roller portion.

3. A developing device according to claim 2, wherein said elastic roller portion is formed of solid rubber.

4. A process cartridge detachable with respect to an image forming apparatus and having one end and another end, comprising:

an electrophotographic photosensitive member;

a developing roller supported by said process cartridge and adapted to develop a latent image formed on said electrophotographic photosensitive member;

a developing blade adapted to regulate the thickness of a toner layer on said developing roller and provided so as to be in contact with said developing roller;

a helical gear provided at one end of said developing roller in an axial direction thereof and adapted to transmit a driving force to said developing roller;

a regulating portion provided at the another end of said process cartridge in the axial direction thereof so as to maintain the position of said developing roller in the axial direction thereof; and urging means, which is provided at the one end of said process cartridge in the axial direction thereof, for urging said developing roller toward said regulating portion, and for urging said developing roller toward the regulating portion so as to maintain the position of said developing roller, wherein said urging means urges said developing roller in the same direction as a direction in which said helical gear urges said developing roller when the driving force is transmitted to said developing roller, wherein the urging force of said urging means is not less than double the weight of said developing roller.

5. A process cartridge according to claim 4, wherein said developing roller has a elastic roller portion.

6. A process cartridge according to claim 5, wherein said elastic roller portion is formed of solid rubber.

* * * * *

UNITED STATES PATENT AND TRADEMARK OFFICE

CERTIFICATE OF CORRECTION

PATENT NO. : 7,215,909 B2
APPLICATION NO. : 11/222788
DATED : May 8, 2007
INVENTOR(S) : Susumu Nittani et al.

It is certified that error appears in the above-identified patent and that said Letters Patent is hereby corrected as shown below:

ON THE TITLE PAGE:

At item (54), Title, “DEVICE,” should read --DEVICE--.

COLUMN 1:

Line 1, “DEVICE,” should read --DEVICE--.

COLUMN 15:

Line 6, “etc.” should read --etc.,--.

COLUMN 16:

Line 28, “a” should read --an--.
Line 62, “a” should read --an--.

Signed and Sealed this

Nineteenth Day of August, 2008

JON W. DUDAS
*Director of the United States Patent and Trademark Office*